US010686004B2

United States Patent
Kato et al.

(10) Patent No.: US 10,686,004 B2
(45) Date of Patent: Jun. 16, 2020

(54) IMAGE CAPTURING ELEMENT AND IMAGE CAPTURING DEVICE IMAGE SENSOR AND IMAGE-CAPTURING DEVICE

(71) Applicant: NIKON CORPORATION, Tokyo (JP)

(72) Inventors: Shutaro Kato, Kawasaki (JP); Toru Takagi, Fujisawa (JP); Takashi Seo, Yokohama (JP); Ryoji Ando, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/085,168

(22) PCT Filed: Feb. 28, 2017

(86) PCT No.: PCT/JP2017/007936
§ 371 (c)(1),
(2) Date: Sep. 14, 2018

(87) PCT Pub. No.: WO2017/169479
PCT Pub. Date: Oct. 5, 2017

(65) Prior Publication Data
US 2019/0081094 A1 Mar. 14, 2019

(30) Foreign Application Priority Data

Mar. 31, 2016 (JP) .................................. 2016-070959

(51) Int. Cl.
*H01L 27/146* (2006.01)
*H04N 5/369* (2011.01)

(52) U.S. Cl.
CPC .... *H01L 27/1464* (2013.01); *H01L 27/14605* (2013.01); *H01L 27/14621* (2013.01);
(Continued)

(58) Field of Classification Search
CPC ......... H01L 51/56; H01L 33/60; H01L 33/62; H01L 33/56; H01L 51/5012
(Continued)

(56) References Cited

U.S. PATENT DOCUMENTS

| 2007/0045513 A1 | 3/2007 | Lee et al. |
| 2009/0135289 A1 | 5/2009 | Kusaka |

(Continued)

FOREIGN PATENT DOCUMENTS

| JP | 2010-177704 A | 8/2010 |
| JP | 2013-055159 A | 3/2013 |

(Continued)

OTHER PUBLICATIONS

May 23, 2017 International Search Report issued in International Patent Application No. PCT/JP2017/007936.
(Continued)

*Primary Examiner* — Andy Huynh
(74) *Attorney, Agent, or Firm* — Oliff PLC

(57) ABSTRACT

An image sensor having a plurality of pixels along a first direction includes: a first pixel having a first photoelectric conversion unit that generates an electric charge through photoelectric conversion and a reflecting portion disposed at least in a part of an area located in the first direction relative to a center of the first photoelectric conversion unit, which reflects part of light having been transmitted through the first photoelectric conversion unit toward the first photoelectric conversion unit; and a second pixel having a second photoelectric conversion unit that generates an electric charge through photoelectric conversion and a second reflecting portion disposed at least in a part of an area located in a direction opposite from the first direction relative to a center of the second photoelectric conversion unit, which reflects part of light having been transmitted through the second
(Continued)

photoelectric conversion unit toward the second photoelectric conversion unit.

20 Claims, 11 Drawing Sheets

(52) U.S. Cl.
CPC .. *H01L 27/14627* (2013.01); *H01L 27/14629* (2013.01); *H04N 5/369* (2013.01)

(58) Field of Classification Search
USPC .......................................... 257/432
See application file for complete search history.

(56) References Cited

U.S. PATENT DOCUMENTS

| | | | |
|---|---|---|---|
| 2012/0194721 A1* | 8/2012 | Sakaida | ............. H04N 5/23212 348/302 |
| 2013/0113964 A1 | 5/2013 | Sasaki et al. | |
| 2014/0132812 A1 | 5/2014 | Soda | |
| 2014/0145287 A1 | 5/2014 | Kato | |
| 2015/0062391 A1* | 3/2015 | Murata | ............. H01L 27/14603 348/280 |
| 2016/0049430 A1 | 2/2016 | Nomura | |
| 2017/0098673 A1 | 4/2017 | Nomura | |
| 2017/0229503 A1 | 8/2017 | Suzuki et al. | |

FOREIGN PATENT DOCUMENTS

| | | |
|---|---|---|
| JP | 2014-213767 A | 11/2014 |
| JP | 2016-127043 A | 7/2016 |
| WO | 2014/156933 A1 | 10/2014 |
| WO | 2016/063727 A1 | 4/2016 |

OTHER PUBLICATIONS

Nov. 5, 2019 partial supplementary European Search Report issued in European Patent Application No. 17774024.8.

Dec. 3, 2019 Office Action issued in Japanese Patent Application No. 2018-508832.

Feb. 3, 2020 Extended Search Report issued in European Patent Application No. 17774024.8.

* cited by examiner (a)

(b)

(a)

(b)

IMAGE CAPTURING ELEMENT AND IMAGE CAPTURING DEVICE IMAGE SENSOR AND IMAGE-CAPTURING DEVICE

TECHNICAL FIELD

The present invention relates to an image sensor and an image-capturing device.

BACKGROUND ART

There is an image-capturing device known in the related art that includes a reflecting layer disposed under a photoelectric conversion unit so as to cause light, having been transmitted through the photoelectric conversion unit, to be reflected at the reflecting layer toward the photoelectric conversion unit (see PTL 1). In the related art, the reflecting layer can only be disposed at a uniform position relative to the photoelectric conversion unit.

CITATION LIST

Patent Literature

PTL 1: Japanese Laid Open Patent Publication No. 2010-177704

SUMMARY OF INVENTION

An image sensor according to the 1st aspect of the present invention having a plurality of pixels along a first direction, comprising: a first pixel having a first photoelectric conversion unit that generates an electric charge through photoelectric conversion of light having entered therein and a reflecting portion disposed at least in a part of an area located in the first direction relative to a center of the first photoelectric conversion unit at a surface crossing a direction in which the light enters, which reflects part of light having been transmitted through the first photoelectric conversion unit toward the first photoelectric conversion unit; and a second pixel having a second photoelectric conversion unit that generates an electric charge through photoelectric conversion of light having entered therein and a second reflecting portion disposed at least in a part of an area located in a direction opposite from the first direction relative to a center of the second photoelectric conversion unit at a surface crossing the direction in which the light enters, which reflects part of light having been transmitted through the second photoelectric conversion unit toward the second photoelectric conversion unit.

An image-capturing device according to the 2nd aspect of the present invention comprising a control unit that controls a position of a focusing lens based upon a signal output from the first pixel and a signal output from the second pixel in the image sensor according to the 1st aspect that captures an image formed via an optical system having included therein the focusing lens, so as to achieve an in-focus state at the image sensor for the image formed via the optical system.

DESCRIPTION OF EMBODIMENT

First Embodiment

Figure 1:
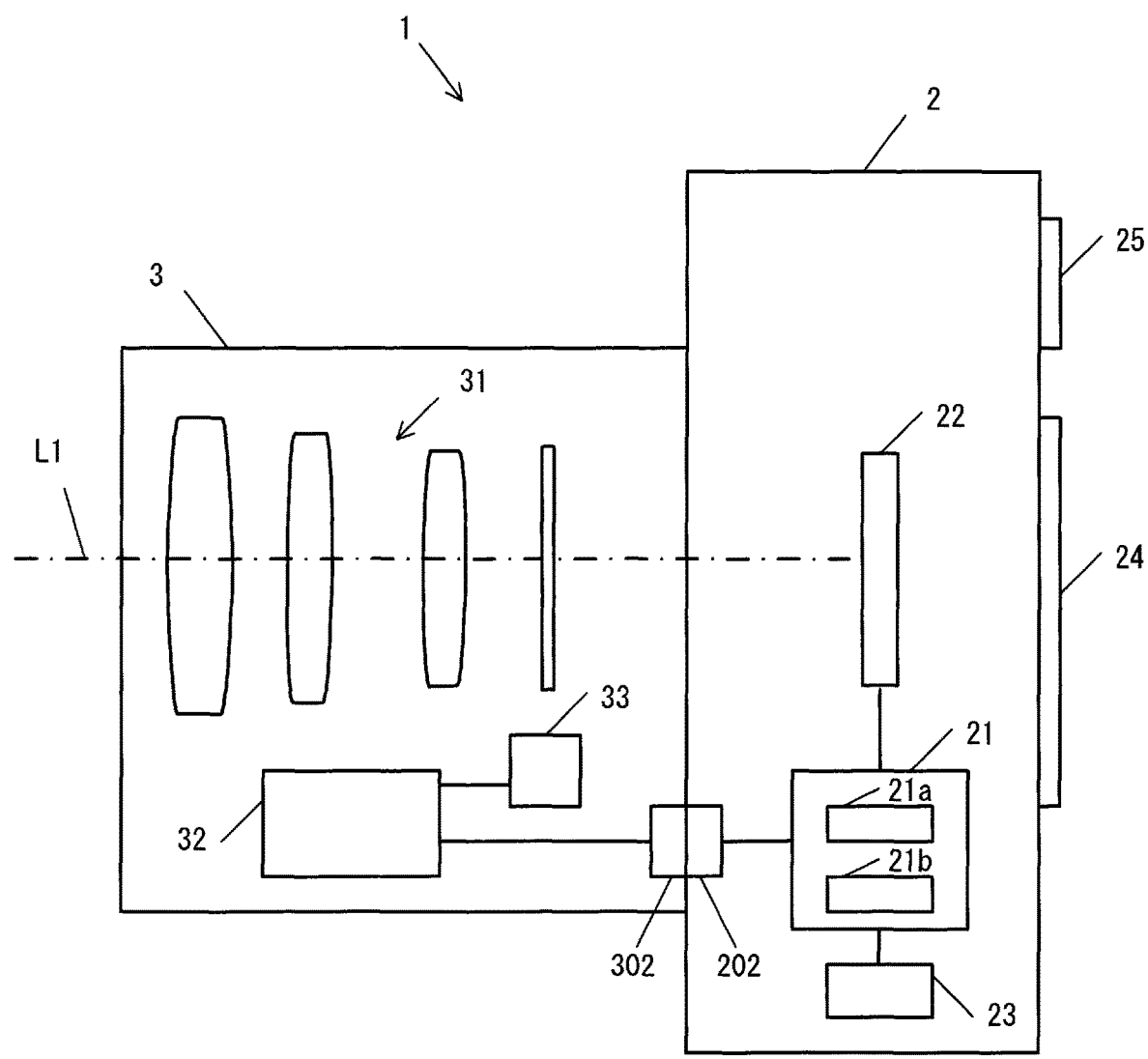
FIG. 1 A diagram illustrating the essential structure of the image-capturing device achieved in a first embodiment FIG. 2 A diagram illustrating how pixels may be disposed in the image sensor achieved in the first embodiment FIG. 3 An illustration indicating how light fluxes enter the image sensor in the first embodiment FIG. 4 A sectional view of a structure that may be adopted in the image sensor in the first embodiment FIG. 5 A sectional view of a structure that may be adopted in the image sensor achieved in variation 1

FIG. 1 is a diagram illustrating the essential structure of a digital camera 1 (hereafter referred to as a camera 1) configured as the image-capturing device in the first embodiment. The camera 1 comprises a camera body 2 and an exchangeable lens 3. The exchangeable lens 3 is mounted at the camera body 2 via a mount unit (not shown). As the exchangeable lens 3 is mounted at the camera body 2, a connecting portion 202 at the camera body 2 and a connecting portion 302 at the exchangeable lens 3 become connected with each other, thereby enabling communication between the camera body 2 and the exchangeable lens 3.

The exchangeable lens 3 includes an image-capturing optical system (image-forming optical system) 31, a lens control unit 32 and a lens memory 33. The image-capturing optical system 31, constituted with a plurality of lenses including a focus adjustment lens (focusing lens) and an aperture, forms a subject image on an image-capturing surface of an image sensor 22 in the camera body 2. The lens control unit 32 adjusts a focus position for the image-capturing optical system 31 by driving the focusing lens forward/backward along an optical axis L1 based upon a signal output from a body control unit 21 in the camera body 2. Signals output from the body control unit 21 include a signal indicating the extent to which the focusing lens is driven, the direction along which the focusing lens is driven, the velocity with which the focusing lens moves and the like. In the lens memory 33 constituted with a non-volatile storage medium or the like, lens information pertaining to the exchangeable lens 3, such as information indicating the position of the exit pupil of the image-capturing optical system 31, is stored. The lens information stored in the lens memory 33 is read out by the lens control unit 32 and is transmitted to the body control unit 21.

At the camera body 2, the body control unit 31, the image sensor 22, a memory 23, a display unit 24 and an operation unit 25 are disposed. The image sensor 22 is an image sensor such as a CCD image sensor or a CMOS image sensor, having a plurality of pixels arranged two-dimensionally (along a row direction in which rows extend and along a column direction in which columns extend). The image sensor 22 receives a light flux having passed through the exit pupil at the image-capturing optical system 31, generates a signal corresponding to the quantity of the received light and outputs the signal thus generated to the body control unit 21. The plurality of pixels at the image sensor 22 each include, for example, an R (red), G (green) or B (blue) color filter.

The subject image is captured through the color filter at each pixel. Signals and RGB color information output from the image sensor 22 are input to the body control unit 21.

The body control unit 21, constituted with a CPU, a ROM, a RAM and the like, controls the various components of the camera 1 based upon a control program. The body control unit 21 also executes various types of signal processing. For instance, the body control unit 21 controls the operations of the image sensor 22 by providing control signals to the image sensor 22. The body control unit 21 includes a focus detection unit 21a and an image data generation unit 21b. The image data generation unit 21b generates image data by executing various types of image processing on signals output from the image sensor 22. The focus detection unit 21a calculates a defocus quantity through a split pupil phase detection method by using signals provided by the image sensor 22 and transmits the defocus quantity to the lens control unit 32. In other words, the focus detection unit 21a calculates a defocus quantity which is a signal for adjusting the focus position of the imaging optical system 31, and transmits it to the lens control unit 32. This means that the focus detection unit 21a calculates the shift quantity between the imaging plane of the image formed by the imaging optical system 31 and the imaging plane of the image sensor 22, by using the signals output from the image sensor 22. Based upon the shift quantity, the body control unit 21 calculates a movement quantity and movement direction of the focusing lens which the focusing lens needs to move. The body control unit 21 transmits the calculated information of the calculated movement quantity and the movement direction of the focusing lens to the lens control unit 32 via the connecting portion 202 and the connecting portion 302. Based upon the information transmitted from the body control unit 21, the lens control unit 32 drives a motor (not shown) so as to move the focusing lens to a position at which an image is formed, via the image-capturing optical system 31, on the image-capturing surface of the image sensor 22, i.e., an in-focus position.

The body control unit 21 writes image data, audio data and like and reads out image data, audio data and the like into/out of the memory 23, which is a recording medium such as a memory card. At the display unit 24, an image generated based upon image data generated by the body control unit 21 is displayed. In addition, photographic information pertaining to photographing operations, such as the shutter speed and the aperture value, a menu screen or the like is also brought up on display at the display unit 24. The operation unit 25 includes a shutter release button, a record button, various setting switches and the like, and outputs an operation signal corresponding to an operation performed at the operation unit 25 to the body control unit 21.

Figure 2:
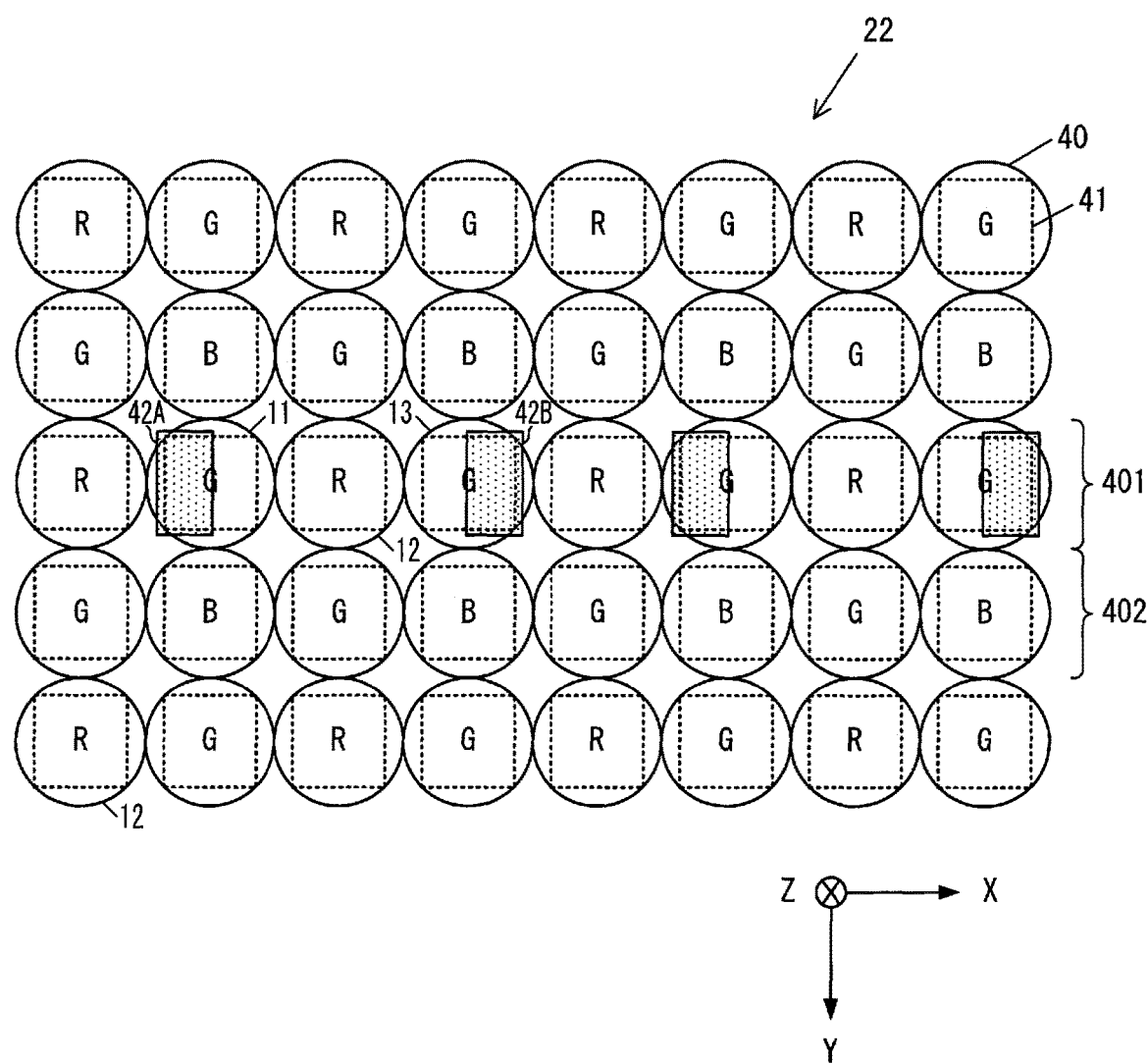

FIG. 2 presents an example of a positional arrangement with which pixels may be disposed at the image sensor 22 in the first embodiment. In the image sensor 22, pixels are arranged two-dimensionally (along the row direction and the column direction). The pixels each include a color filter among, for instance, an R (red) color filter, a G (green) color filter and a B (blue) color filter having spectral characteristics different from one another, disposed thereat. At an R color filter, transmitted light is primarily in the red color wavelength range, at a G color filter, transmitted light is primarily in the green color wavelength range and at a B color filter, transmitted light is primarily in the blue color wavelength range.

The pixels take on spectral characteristics different from one another in correspondence to the color filters disposed thereat. At the image sensor 22, a pixel group 401 made up with pixels having R and G color filters disposed at alternate positions and a pixel group 402 made up with pixels having G and B color filters disposed at alternate positions (hereafter a pixel having an R color filter, a pixel having a G color filter and a pixel having a B color filter will be respectively referred to as an R pixel, a G pixel and a B pixel) are alternately arranged two-dimensionally. As a result, R pixels, G pixels and B pixels are disposed in a Bayer array.

The image sensor 22 includes R, G and B image-capturing pixels 12, set in a Bayer array, as explained above, and image-capturing/focus detection pixels 11 and 13 disposed as replacements for some of the image-capturing pixels 12. An image-capturing pixel 12 outputs a signal to be used by the image data generation unit 21b for purposes of image data generation, i.e., an image-capturing signal. An image-capturing/focus detection pixel 11 or 13 outputs an image-capturing signal and a signal to be used by the focus detection unit 21a for purposes of the focus quantity calculation, i.e., a focus detection signal. It is to be noted that the image-capturing/focus detection pixels 11 and 13 may be focus detection pixels that exclusively output focus detection signals to be used by the focus detection unit 21a to calculate the defocus quantity. The focus detection unit 21a calculates the defocus quantity based upon the focus detection signals output from the focus detection pixels 11 and 13. The image-capturing/focus detection pixels 11 and 13, disposed as replacements for G image-capturing pixels set along the row direction, take on G spectral characteristics. In other words, the image-capturing/focus detection pixels 11 and 13 each output an image signal generated based upon an electric charge generated through photoelectric conversion of light in the G wavelength range. In addition, the image-capturing/focus detection pixels 11 and 13 are disposed at alternate positions along the row direction (along an X axis in FIG. 2) with an R image-capturing pixel 12 disposed between each pair of image-capturing/focus detection pixels 11 and 13. A signal output from the image-capturing/focus detection pixel 11 and a signal output from the image-capturing/focus detection pixel 13 are used as a pair of focus detection signals for phase difference type focus detection, as will be described later. It is to be noted that the distance that sets apart a pixel 11 and the pixel 13 paired up with the pixel 11 may be set freely. In addition, units each made up with a pixel 11, a pixel 12 and a pixel 13 may be disposed over any intervals along the row direction or along the column direction, or along both the row direction and the column direction.

The image-capturing pixels 12 each include a microlens 40 and a photoelectric conversion unit 41. The image-capturing/focus detection pixels 11 and 13 each include a reflecting portion 42A or 42B in addition to a microlens 40 and a photoelectric conversion unit 41. The microlens 40, the photoelectric conversion unit 41 and the reflecting portion 42A or 42B are disposed in this order along the direction of light entry. The reflecting portion 42A in an image-capturing/focus detection pixel 11 is disposed at a position different from the position at which the reflecting portion 42B is disposed in an image-capturing/focus detection pixel 13. It is to be noted that the image-capturing/focus detection pixels 11 and 13 may be disposed at alternate positions along the row direction with two R image-capturing pixels 12 and one G image-capturing pixel 12 disposed between an image-capturing/focus detection pixel 11 and the image-capturing/focus detection pixel 13 paired up with the image-capturing/focus detection pixel 11, as will be explained later in reference to FIG. 7 or FIG. 8. The G image-capturing pixel 12 disposed between the image-capturing/focus detection pixels 11 and 13 in this positional arrangement does not include a reflecting portion 42A or a reflecting portion 42B.

As illustrated in FIG. 2, the reflecting portion 42A in each image-capturing/focus detection pixel 11 is disposed so that it ranges in correspondence to an area of the photoelectric conversion unit 41 substantially amounting to the left half thereof. The reflecting portion 42B in each image-capturing/focus detection pixel 13, on the other hand, is disposed so that it ranges in correspondence to an area of the corresponding photoelectric conversion unit 41 substantially amounting to the right half thereof. In other words, the reflecting portion 42A is disposed in correspondence to one of the two areas defined by splitting the photoelectric conversion unit 41 into two along the direction in which the image-capturing/focus detection pixels 11 and 13 are disposed (by splitting the photoelectric conversion unit 41 along a Y axis shown in FIG. 2), whereas the reflecting portion 42B is disposed in correspondence to the other area defined by splitting the photoelectric conversion unit 41 into two areas.

It is to be noted that while the image-capturing/focus detection pixels 11 and 13 are disposed along the row direction (along the X axis in FIG. 2), i.e. along the lateral direction in FIG. 2, they may instead be disposed along the column direction (along the Y axis in FIG. 2) i.e., along the longitudinal direction. When the image-capturing/focus detection pixels 11 and 13 are disposed along the column direction, the reflecting portions 42A will each be disposed in correspondence to one of the two areas substantially amounting to the upper half and the lower half of the photoelectric conversion unit 41 and the reflecting portions 42B will each be disposed in correspondence to the other area substantially amounting to the upper half or the lower half of the photoelectric conversion unit 41. In other words, the reflecting portion 42A will be disposed in correspondence to one of the two areas defined by splitting the photoelectric conversion unit 41 into two along the direction crossing the direction in which the image-capturing/focus detection pixels 11 and 13 are disposed (by splitting the photoelectric conversion unit 41 along the X axis in FIG. 2), whereas the reflecting portion 42B will be disposed in correspondence to the other area defined by splitting the photoelectric conversion unit 41 into two.

Figure 3:
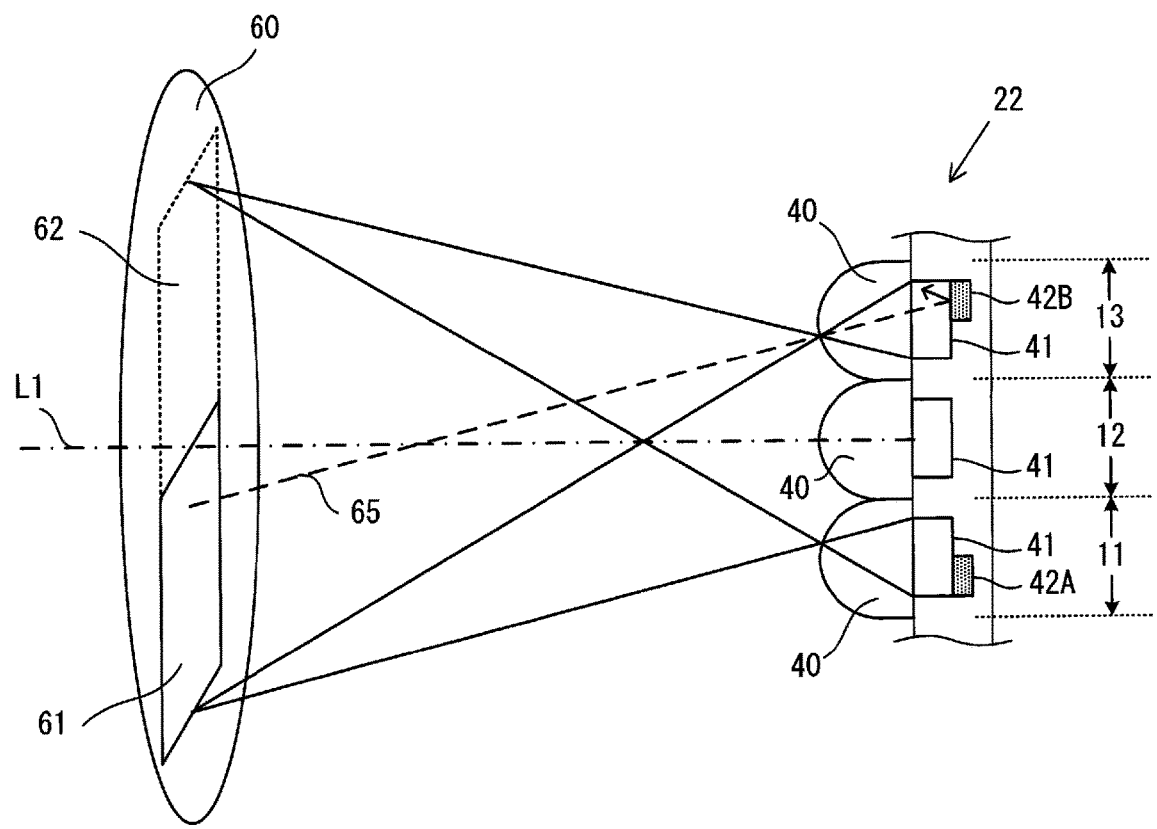

FIG. 3 illustrates light fluxes that enter the image sensor in the first embodiment. It is to be noted that FIG. 3 shows one image-capturing pixel 12, one image-capturing/focus detection pixel 11 and one image-capturing/focus detection pixel 13. The image-capturing pixel 12 includes a microlens 40 and a photoelectric conversion unit 41 that receives a light flux having been transmitted through the microlens 40 as explained earlier. The image-capturing/focus detection pixels 11 and 13 each include a microlens 40, a photoelectric conversion unit 41 at which a light flux having been transmitted through the microlens 40 enters and a reflecting portion 42A or 42B that reflects a light flux having been transmitted through part of the photoelectric conversion unit 41 toward the photoelectric conversion unit 41, as has been explained earlier.

It is to be noted that the image-capturing pixel 12 in FIG. 3 is a G image-capturing pixel 12. When image-capturing/focus detection pixels 11 and 13 and image-capturing pixels 12 are disposed in the positional arrangement illustrated in FIG. 2, the G image-capturing pixel 12 is a G image-capturing pixel 12 disposed near the image-capturing/focus detection pixel 11 or the image-capturing/focus detection pixel 13.

When image-capturing/focus detection pixels 11 and 13 and image-capturing pixels 12 are disposed in the positional arrangement illustrated in FIG. 7 or FIG. 8 as will be explained later, the G image-capturing pixel 12 is the G image-capturing pixel disposed between the image-capturing/focus detection pixel 11 and the image-capturing/focus detection pixel 13. However, it may be a G image-capturing pixel 12 disposed near the image-capturing/focus detection pixel 11 or the image-capturing/focus detection pixel 13, instead.

At the image-capturing/focus detection pixel 11, a first light flux having passed through a first pupil area 61 and a second light flux having passed through a second pupil area 62 enter the photoelectric conversion unit 41 via the microlens 40. The second light flux, which is one of the two light fluxes, i.e., the first and second light fluxes, having entered the photoelectric conversion unit 41, passes through the photoelectric conversion unit 41, is reflected at the reflecting portion 42A and reenters the photoelectric conversion unit 41. At the other image-capturing/focus detection pixel 13, the first light flux having passed through the first pupil area 61 and the second light flux having passed through the second pupil area 62 enter the photoelectric conversion unit 41 via the microlens 40. The first light flux, which is one of the two light fluxes, i.e., the first and second light fluxes, having entered the photoelectric conversion unit 41, passes through the photoelectric conversion unit 41, is reflected at the reflecting portion 42B and reenters the photoelectric conversion unit 41. It is to be noted that a dotted line 65 in FIG. 3 schematically indicates the first light flux having passed through the first pupil area 61, which is then transmitted through the microlens 40 and the photoelectric conversion unit 41 before it is reflected at the reflecting portion 42B in the image-capturing/focus detection pixel 13.

At the image-capturing pixel 12, a light flux, having passed through both the first pupil area 61 and the second pupil area 62 of an exit pupil 60 of the image-capturing optical system 31 in FIG. 1, enters the photoelectric conversion unit 41 via the microlens 40. The image-capturing pixel 12 outputs a signal S1 pertaining to the light flux having passed through both the first and second pupil areas 61 and 62. Namely, at the image-capturing pixel 12, light having passed through both the first and second pupil areas 61 and 62 undergoes photoelectric conversion and a signal S1 generated based upon an electric charge generated through the photoelectric conversion is output from the image-capturing pixel 12. The image-capturing/focus detection pixel 11 outputs a signal (S1+S2) representing the sum of the signal S1 generated based upon the electric charge resulting from photoelectric conversion of the first and second light fluxes having passed through the first pupil area 61 and the second pupil area 62 and a signal S2 generated based upon an electric charge resulting from photoelectric conversion of the second light flux reflected from the reflecting portion 42A. The image-capturing/focus detection pixel 13 outputs a signal (S1+S3) representing the sum of the signal S1 generated based upon the electric charge resulting from photoelectric conversion of the first and second light fluxes having passed through the first pupil area 61 and the second pupil area 62 and a signal S3 generated based upon an electric charge resulting from photoelectric conversion of the first light flux reflected from the reflecting portion 42B.

The image data generation unit 21b in the body control unit 21 generates image data for the subject image based upon the signal S1 output from the image-capturing pixel 12 and the signals (S1+S2) and (S1+S3) output from the image-capturing/focus detection pixels 11 and 13 respectively. It is to be noted that the gains applied to the signals (S1+S2) and (S1+S3) output from the image-capturing/focus detection pixels 11 and 13, should be lowered relative to the gain applied to the signal S1 output from the image-capturing pixel 12 in order to minimize the influence of the signals S2 and S3 during image data generation.

The focus detection unit 21a in the body control unit 21 executes a correlation operation in order to calculate the in-focus position based upon the signal S1 provided from the image-capturing pixel 12, the signal (S1+S2) provided from the image-capturing/focus detection pixel 11 and the signal (S1+S3) provided from the image-capturing/focus detection pixel 13. Through this correlation operation, the focus detection unit 21a calculates a shift quantity representing the extent to which an image formed with the first light flux having passed through the first pupil area 61 and an image formed with the second light flux having passed through the second pupil area 62 are offset relative to each other and then calculates a defocus quantity based upon the image shift quantity.

The focus detection unit 21a calculates the difference between the output from the image-capturing pixel 12 and the output from the image-capturing/focus detection pixel 11 and the difference between the output from the image-capturing pixel 12 and the output from the image-capturing/focus detection pixel 13. Based upon the differences thus determined, the focus detection unit 21a calculates the image shift quantity representing the extent to which the image formed with the first light flux having passed through the first pupil area 61 and the image formed with the second light flux having passed through the second pupil area 62 are offset relative to each other. It then calculates the defocus quantity based upon the image shift quantity. For instance, it calculates the signal S2 generated based upon the electric charge resulting from the photoelectric conversion of the second light flux reflected by the reflecting portion 42A by using the signal S1 and the signal (S1+S2). The focus detection unit 21a also calculates the signal S3 generated based upon the electric charge resulting from the photoelectric conversion of the first light flux reflected by the reflecting portion 42B by using the signal S1 and the signal (S1+S3). The focus detection unit 21a then determines the defocus quantity by detecting the phase difference between the signal S2 and the signal S3.

In the embodiment, the reflecting portions 42A and 42B are disposed in the image-capturing/focus detection pixel 11 and the image-capturing/focus detection pixel 13 respectively, at positions different from each other along the direction crossing the direction in which light enters, and the reflecting portion 42A in the image-capturing/focus detection pixel 11 reflects incoming light advancing via the pupil area 62, whereas the reflecting portion 42B in the image-capturing/focus detection pixel 13 reflects incoming light advancing via the pupil area 61. As a result, the light having passed through the pupil area 62 is received in a greater amount at the photoelectric conversion unit 41 of the image-capturing/focus detection pixel 11. The light having passed through the pupil area 61 is received in a greater amount at the photoelectric conversion unit 41 in the image-capturing/focus detection pixel 13. Thus, the signal component attributable to the light having passed through the pupil area 62 increases in the signal output from the image-capturing/focus detection pixel 11. The signal component attributable to the light having passed through the pupil area 61 increases in the signal output from the image-capturing/focus detection pixel 13. By using the signals provided from the image-capturing pixel 12, the image-capturing/focus detection pixel 11 and the image-capturing/focus detection pixel 13, phase difference information of the subject images can be obtained and the defocus quantity can, therefore, be calculated. In addition, the phase difference between the subject images is detected by using reflected light without having to dispose a light-shielding film at the light entry surface for purposes of phase difference detection, as is required in the related art. This means that the opening rate at the pixels is not reduced. Furthermore, since light having passed through the photoelectric conversion units 41 are reflected to the photoelectric conversion units 41 via the reflecting portions 42A and 42B, the sensitivity (quantum efficiency) at the photoelectric conversion units 41 in the pixels can be improved.

Figure 4:
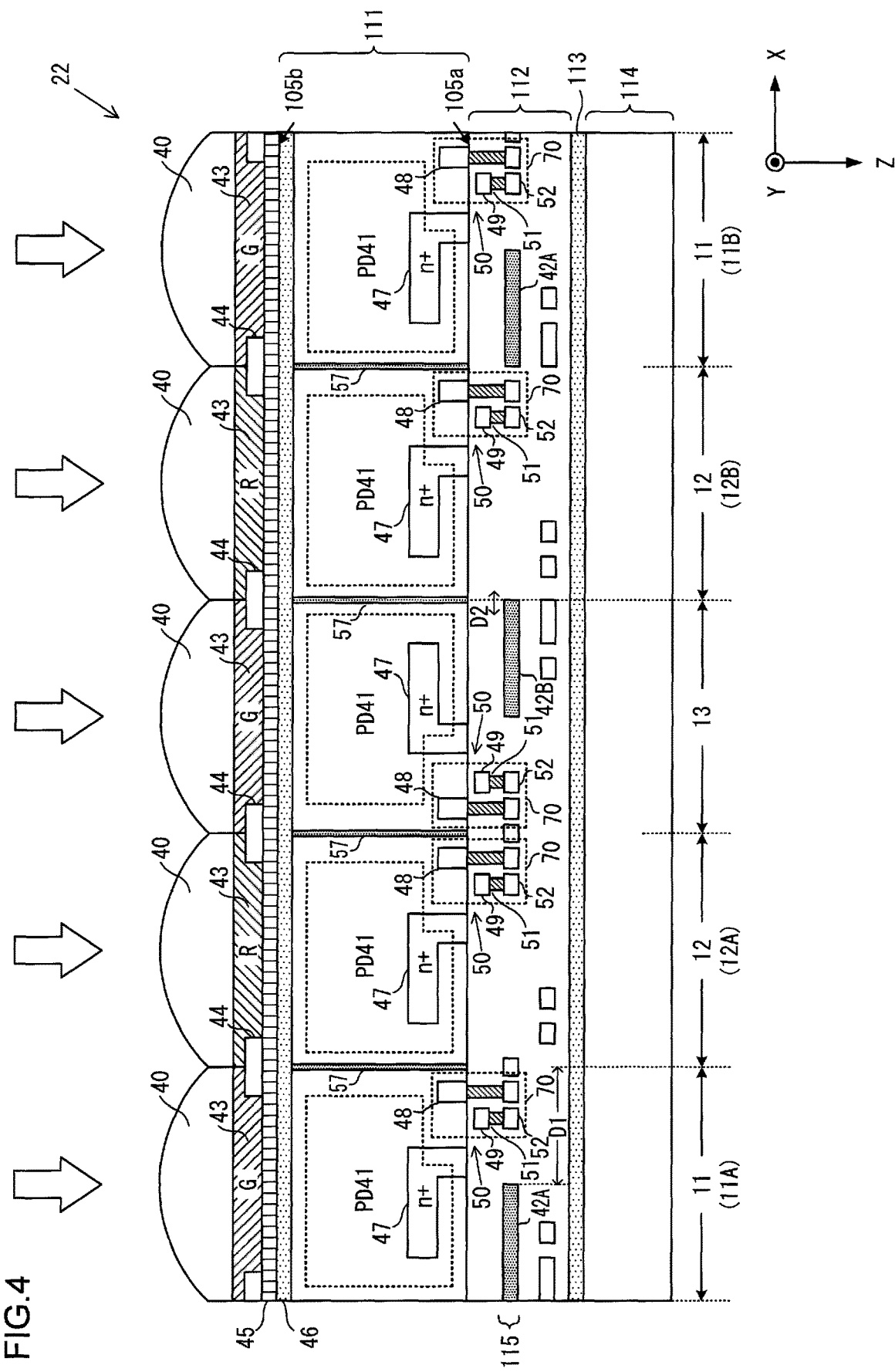

FIG. 4 is a sectional view of a structure that may be adopted in the image sensor in the first embodiment. The image sensor 22 in FIG. 4 is a back illuminated image sensor. The image sensor 22 includes a first substrate (may be otherwise referred to as a semiconductor layer) 111 and a second substrate 114. The first substrate 111 is constituted with a semiconductor substrate, whereas the second substrate 114 may be constituted with a semiconductor substrate, a glass substrate or the like. The second substrate 114 functions as a support substrate for the first substrate 111. The first substrate 111 is laminated onto the second substrate 114 via an adhesive layer 113. As indicated in FIG. 4, incident light advances mainly toward a Z axis + side to which the unfilled arrows point. In addition, coordinate axes are set so that the direction running rightward on the drawing sheet perpendicular to the Z axis will be an X axis + side and the direction moving toward the viewer of the drawing, perpendicular to the Z axis and the X axis, is a Y axis + side. In the example presented in FIG. 4, an image-capturing/focus detection pixel 11 (hereafter may be also referred to as an image-capturing/focus detection pixel 11A), an image-capturing pixel 12 (hereafter may be also referred to as an image-capturing pixel 12A), an image-capturing/focus detection pixel 13, an image-capturing pixel 12 (hereafter may be also referred to as an image-capturing pixel 12B) and an image-capturing/focus detection pixel 11 (hereafter may be also referred to as an image-capturing/focus detection pixel 11B) are disposed in this order so that the image-capturing/focus detection pixel 11B is located further toward the X axis + side.

The image-capturing/focus detection pixels 11, the image-capturing pixels 12 and the image-capturing/focus detection pixel 13 each include a microlens 40, a color filter 43, a light shielding film 44, an anti-reflection film 45, a p+ layer 46 and a diffusion isolation portion 57. The microlens 40 condenses light having entered therein onto the corresponding photoelectric conversion unit 41. In the example presented in FIG. 4, the image-capturing/focus detection pixels 11 each include a G color filter, the image-capturing pixels 12 each include an R color filter and the image-capturing/focus detection pixel 13 includes a G color filter. The light shielding film 44 blocks light from leaking into adjacent pixels. The p+ layer 46, formed by using a p-type impurity, reduces a dark current coming into the photoelectric conversion unit 41. Via the diffusion isolation portion 57, the photoelectric conversion units 41 are separated one from another.

The first substrate 111 includes a first surface 105a at which electrodes and an insulating film are disposed, and a second surface 105b different from the first surface. The second surface 105b is a light entry surface at which light enters. A wiring layer 112 is laminated on the first surface 105a of the first substrate 111. The image sensor 22 includes a plurality of photoelectric conversion units 41 and a plurality of output units 70, both disposed along the X axis and along the Y axis.

At a photoelectric conversion unit 41, constituted with, for instance, a photodiode (PD), light having entered therein is converted to an electric charge. In addition, an output unit 70 generates a signal based upon the electric charge resulting from photoelectric conversion executed at the corresponding photoelectric conversion unit 41 and outputs the signal thus generated. The output unit 70 outputs the signal to the wiring layer 112. The output unit 70 is configured with transistors such as a transfer transistor (transfer unit) 50 and an amplifier transistor. An n+ region 47 and an n+ region 48 formed in the semiconductor layer 111, each constituted of an n-type impurity, respectively function as the source region and the drain region in the transfer transistor 50 in the example presented in FIG. 4. In addition, an electrode 49 formed at the wiring layer 112 via an insulating film functions as the gate electrode (transfer gate) of the transfer transistor 50. The n+ region 47 also functions as part of the photoelectric conversion unit 41. The electrode 49 is connected to a wiring 52 of the output unit 70, disposed at a metal layer 115 via a contact 51. The image-capturing/focus detection pixels 11 and 13 and the image-capturing pixels 12 are disposed along the row direction in which rows extend (along the X axis), and the wirings 52 in the image-capturing/focus detection pixels 11 and 13 and the image-capturing pixels 12 are connected with one another and are used as a common wiring.

In the wiring layer 112, which includes conductive films (metal films) and insulating films, a plurality of wirings, a plurality of vias and the like are disposed. The conductive films may be constituted of copper, aluminum or the like. The insulating films, which include insulating films disposed between conductive films, may each be constituted with an oxide film or a nitride film. Reflecting portions 42A and reflecting portions 42B are disposed in the wiring layer 112. The reflecting portions 42A and the reflecting portions 42B are disposed in the metal layer 115. The reflecting portions 42A and the reflecting portion 42B may each be a conductive film constituted of aluminum, copper or tungsten, or may each be a multilayer film that includes an aluminum layer, a copper layer and a tungsten layer. The reflecting portions 42A and the reflecting portions 42B included in the structure achieved in the example presented in FIG. 4 are each constituted with a conductive film that covers substantially half of the corresponding photoelectric conversion unit 41 in the metal layer 115. In addition, part of a wiring formed in the wiring layer 112, e.g., part of a signal line connected to an output unit 70, may be used as a reflecting portion 42. In such a case, the reflecting portions 42A and the reflecting portions 42B will each be used both as a conductive film at which light is reflected and as a signal line for signal transmission. It is to be noted that the reflecting portions 42A and the reflecting portion 42B may each be constituted with an insulating film. In such a case, part of the insulating film or part of the metal layer used for an output unit 70 may be used as a reflecting portion 42.

The reflecting portions 42A and the reflecting portions 42B are disposed at positions set apart over different distances from adjacent pixels along a direction crossing the direction along which light enters. For instance, the reflecting portion 42A in the image-capturing/focus detection pixel 11A in FIG. 4 is disposed at a predetermined first distance D1, measured along the X axis, from the image-capturing pixel 12A adjacent to the image-capturing/focus detection pixel 11A. The reflecting portion 42B in the image-capturing/focus detection pixel 13 in FIG. 4 is disposed at a predetermined second distance D2, different from the first distance D1, measured along the X axis, from the image-capturing pixel 12B adjacent to the image-capturing/focus detection pixel 13. It is to be noted that as will be explained later, the distances from the adjacent pixels may each be measured from a diffusion isolation portion 57. For instance, the first distance D1 may be the distance between the diffusion isolation portion 57 of the image-capturing pixel 12A and the reflecting portion 42A. The second distance D2 may be the distance between the diffusion isolation portion 57 of image-capturing pixel 12B and the reflecting portion 42B. Furthermore, the first distance D1 or the second distance D2 may be no distance at all.

A reflecting portion 42A and a reflecting portion 42B are disposed between the output unit 70 of an image-capturing/focus detection pixel 11 and the output unit 70 of an image-capturing/focus detection pixel 13. In the example presented in FIG. 4, the reflecting portion 42A in the image-capturing/focus detection pixel 11B and the reflecting portion 42B in the image-capturing/focus detection pixel 13 are disposed between the output unit 70 of the image-capturing/focus detection pixel 11B and the output unit 70 of the image-capturing/focus detection pixel 13. The output unit 70 in an image-capturing/focus detection pixel 11 and the output unit 70 in an image-capturing/focus detection pixel 13 are disposed between a reflecting portion 42A and a reflecting portion 42B. In the example presented in FIG. 4, the output unit 70 in the image-capturing/focus detection pixel 11A and the output unit 70 in the image-capturing/focus detection pixel 13 are disposed between the reflecting portion 42A in the image-capturing/focus detection pixel 11 and the reflecting portion 42B in the image-capturing/focus detection pixel 13.

A reflecting portion 42A and a reflecting portion 42B are disposed at positions set apart over different distances from the diffusion isolation portions 57 present between the photoelectric conversion units corresponding to the reflecting portions and the photoelectric conversion units belonging to adjacent pixels. For instance, the reflecting portion 42A in the image-capturing/focus detection pixel 11A is disposed over a predetermined third distance from the diffusion isolation portion 57 disposed between the photoelectric conversion unit 41 in the image-capturing/focus detection pixel 11A and the photoelectric conversion unit 41 in the adjacent image-capturing pixel 12A in FIG. 4. The reflecting portion 42B in the image-capturing/focus detection pixel 13, on the other hand, is disposed over a predetermined fourth distance, different from the third distance, from the diffusion isolation portion 57 disposed between the photoelectric conversion unit 41 in the image-capturing/focus detection pixel 13 and the photoelectric conversion unit in the adjacent image-capturing pixel 12B. In addition, the photoelectric conversion unit 41 in an image-capturing/focus detection pixel 11 is disposed between the second surface 105b, i.e., the light entering surface through which light enters the image-capturing/focus detection pixel 11, and the reflecting portion 42A, whereas the photoelectric conversion unit 41 in the image-capturing/focus detection pixel 13 is disposed between the second surface 105b, i.e., the light entry surface through which light enters the image-capturing/focus detection pixel 13, and the reflecting portion 42B. This means that the photoelectric conversion unit 41 and the reflecting portion 42A are disposed in sequence along the light entry direction (toward the Z axis + side) in the image-capturing/focus detection pixel 11. Likewise, the photoelectric conversion unit 41 and the reflecting portion 42B are disposed in sequence along the light entry direction in the image-capturing/focus detection pixel 13.

Moreover, a reflecting portion 42A and a reflecting portion 42B are disposed between the wiring 52 at the output unit 70 of an image-capturing/focus detection pixel 11 and the wiring 52 at the output unit 70 of an image-capturing/focus detection pixel 13. In the example presented in FIG. 4, the reflecting portion 42A in the image-capturing/focus detection pixel 11B and the reflecting portion 42B in the image-capturing/focus detection pixel 13 are disposed between the wiring 52 at the output unit 70 in the image-capturing/focus detection pixel 11B and the wiring 52 at the output unit 70 in the image-capturing/focus detection pixel 13. In addition, the output units 70 in the image-capturing pixel 12A and the image-capturing pixel 12B are each disposed between a reflecting portion 42A and a reflecting portion 42B in in the example presented in FIG. 4. The wirings 52 at the output units 70 of the image-capturing pixel 12A and the image-capturing pixel 12B are each disposed between a reflecting portion 42A and a reflecting portion 42B. Furthermore, the image-capturing pixel 12A is disposed between the reflecting portion 42A in the image-capturing/focus detection pixel 11A and the reflecting portion 42B in the image-capturing/focus detection pixel 13, whereas the image-capturing pixel 12B is disposed between the reflecting portion 42A in the image-capturing/focus detection pixel 11B and the reflecting portion 42B in the image-capturing/focus detection pixel 13.

A reflecting portion 42A is disposed over at least part of the area located on the left side (toward the X axis − side) defined by splitting the corresponding photoelectric conversion unit 41 with a line passing through the center thereof and running parallel to the Y axis, over a plane (an XY plane) ranging crossing the light entry direction (advancing toward the Z axis + side). A reflecting portion 42B is disposed over at least part of the area located on the right side (toward the X axis + side) defined by splitting the corresponding photoelectric conversion unit 41 with a line passing through the center thereof and running parallel to the Y axis, over the plane (an XY plane) ranging crossing the light entry direction (advancing toward the Z axis + side). It is to be noted that a reflecting portion 42A may instead be disposed over at least part of an area located on the upper side (toward the Y axis − side) defined by splitting the corresponding photoelectric conversion unit 41 with a line passing through the center thereof and running parallel to the X axis on the plane (an XY plane) ranging crossing the light entry direction (advancing toward the Z axis + side). A reflecting portion 42B may instead be disposed over at least part of an area located on the lower side (toward the Y axis + side) defined by splitting the corresponding photoelectric conversion unit 41 with a line passing through the center of the photoelectric conversion unit 41 and running parallel to the X axis on the plane (an XY plane) ranging crossing the light entry direction (advancing toward the Z axis + side).

The reflecting portions 42A and the reflecting portions 42B each reflect light having been transmitted through the corresponding photoelectric conversion units 41 toward the photoelectric conversion unit 41. The photoelectric conversion units 41 in an image-capturing/focus detection pixel 11 and an image-capturing/focus detection pixel 13 each receive light having entered therein via the corresponding microlens 40 and also light reflected by the reflecting portion 42A or the reflecting portion 42B, and generate an electric charge corresponding to the amount of light thus received. In addition, the photoelectric conversion unit 41 in an image-capturing pixel 12 receives light having entered therein via the microlens 40 and generates an electric charge corresponding to the amount of light thus received. Each output unit 70 outputs a signal, generated based upon the electric charge provided from the corresponding photoelectric conversion unit 41, to the wiring layer 112. Signals output from the individual pixels to the wiring layer 112 undergo signal processing, such as A/D conversion via the peripheral circuits and the like disposed around the pixels before they are output to the body control unit 21 shown in FIG. 1.

As explained earlier, the focus detection unit 21a in the body control unit 21 calculates the defocus quantity by using signals output from the image sensor 22, which are generated based upon electric charges resulting from photoelectric conversion. For instance, the focus detection unit 21a obtains a signal S2 by using a signal (S1+S2), provided from an image-capturing/focus detection pixel 11, and a signal S1 provided from an image-capturing pixel 12 in a subtraction operation. In addition, the focus detection unit 21a obtains a signal S3 by using a signal (S1+S3), provided from an image-capturing/focus detection pixel 13, and a signal S1 provided from an image-capturing pixel 12, in a subtraction operation. The focus detection unit 21a is able to obtain phase difference information pertaining to the phase difference between images formed with a pair of light fluxes having entered via different pupil areas at the image-capturing optical system 31 by executing a correlation operation based upon the signal S2 and the signal S3 and thus able to calculate the defocus quantity through the phase detection method. Furthermore, the lens control unit 32 is able to adjust the focus position for the image-capturing optical system 31 based upon the defocus quantity output from the body control unit 21.

The following advantages and operations are achieved through the embodiment described above.

(1) The image sensor 22 includes a first pixel 11 having a first photoelectric conversion unit 41 that generates an electric charge through photoelectric conversion of light having entered therein and a first reflecting portion 42A disposed over a first distance D1 measured from an adjacent pixel 12A, which reflects light having passed through the first photoelectric conversion unit 41, and a second pixel 13 having a second photoelectric conversion unit 41 that generates an electric charge through photoelectric conversion of light having entered therein and a second reflecting portion 42B disposed over a second distance D2, different from the first distance D1, measured from an adjacent pixel 12B, which reflects light having passed through the second photoelectric conversion unit 41. Namely, the structure achieved in the embodiment includes a pixel 11 and a pixel 13 with reflecting portions 42 thereof disposed at positions different from each other. As a result, phase difference information pertaining to the phase difference between subject images can be obtained by using signals provided from the pixel 11 and the pixel 13.

(2) The image sensor 22 includes a first pixel 11 having a first photoelectric conversion unit 41 that generates an electric charge through photoelectric conversion of light having entered therein and a first output unit 70 that outputs a signal generated based upon the electric charge generated in the first photoelectric conversion unit 41, a second pixel 13 having a second photoelectric conversion unit 41 that generates an electric charge through photoelectric conversion of light having entered therein and a second output unit 70 that outputs a signal generated based upon the electric charge generated in the second photoelectric conversion unit 41, a first reflecting portion 42A disposed between the first output unit 70 and the second output unit 70, which reflects light having passed through the first photoelectric conversion unit 41, and a second reflecting portion 42B disposed between the first output unit 70 and the second output unit 70, which reflects light having passed through the second photoelectric conversion unit 41. This structure makes it possible to obtain phase difference information pertaining to the phase difference between subject images by using signals provided from the pixel 11 and the pixel 13.

In addition, in conjunction with a third pixel, which exclusively operates image capturing, adjacent to the first pixel or the second pixel along the row direction (X direction), and includes a third photoelectric conversion unit 41 that generates an electric charge through photoelectric conversion of light having entered therein and a third output unit 70 that outputs a signal generated based upon the electric charge generated in the third photoelectric conversion unit 41, the first reflecting portion 42A or the second reflecting portion 42B may be disposed between the third output unit 70 and the first output unit 70 or between the third output unit 70 and the second output unit 70.

Alternatively, the first output unit 70 may be disposed between the third output unit and the first reflecting portion 42A, or the second output unit 70 may be disposed between the third output unit 70 and the second reflecting portion 42B.

(3) The first reflecting portion 42A is disposed over a third distance from a separation portion 57 disposed between the first photoelectric conversion unit 41 and a photoelectric conversion unit 41 in an adjacent pixel, whereas the second reflecting portion 42B is disposed over a fourth distance from a separation portion 57 disposed between the second photoelectric conversion unit 41 and a photoelectric conversion unit 41 in an adjacent pixel. By adopting this structure, phase difference information pertaining to the phase difference between images formed with a pair of light fluxes having entered via different pupil areas can be obtained.

(4) A focus control device comprises the image sensor 22 and a control unit (lens control unit 32) that adjusts the focus position for an optical system (image-capturing optical system 31) based upon a signal output from the first output unit 70 and a signal output from the second output unit 70 in the image sensor 22 having received light having entered therein via the optical system. Thus, phase difference information pertaining to the phase difference between subject images can be obtained based upon reflected light and consequently, the focus position can be adjusted based upon the phase difference information.

(5) A focus detection device comprises the image sensor 22 and a focus detection unit (body control unit 21) that executes focus detection in an optical system (image-capturing optical system 31) based upon a signal provided from the first photoelectric conversion unit 41 and a signal provided from the second photoelectric conversion unit 41, both having received light having entered therein via the optical system. Thus, focus detection can be executed for the optical system based upon phase difference information pertaining to the phase difference between subject images, obtained based upon reflected light.

(6) As pixels become increasingly miniaturized, the size of an opening at a pixel may become smaller (shorter) than the wavelengths of light, resulting in restricted entry of light into the photoelectric conversion unit in the pixel. Furthermore, since the amount of light received at the photoelectric conversion unit decreases, the electric charge resulting from the photoelectric conversion, too, will be decreased. As a result, it is bound to become difficult to execute focus detection in the optical system and adjust the focusing condition of the optical system based upon phase difference information generated by using signals generated from electric charges. The quantity of light received will further decrease at a pixel that includes a light shielding film disposed at the light entry surface for purposes of phase difference detection. This means that it will become even more difficult to execute focus detection for the optical system and adjust the focusing condition at the optical system based upon phase difference information. In this embodiment, however, focus detection can be executed for the optical system and the focusing condition at the optical system can be adjusted based upon phase difference information without having to dispose a light shielding film at the light entry surface. Through the embodiment, accurate focus adjustment can be achieved by preventing a decrease in the quantity of light received at pixels and a decrease in the focus detection accuracy even when the pixels are highly miniaturized.

(7) The pixels 11 and the pixels 13, functioning as focus detection pixels in the embodiment, assure sensitivity achieving a level equivalent to that of pixels without reflecting portions. This means that defect correction and the like can be executed with better ease for signals provided from the pixels 11 and the pixels 13, which, in turn, makes it possible to prevent them from becoming defective as image-capturing pixels used for purposes of image generation.

The following variations are also within the scope of the present invention and one of or a plurality of the variations may be adopted in combination with the embodiment described above.

(Variation 1)

Figure 5:
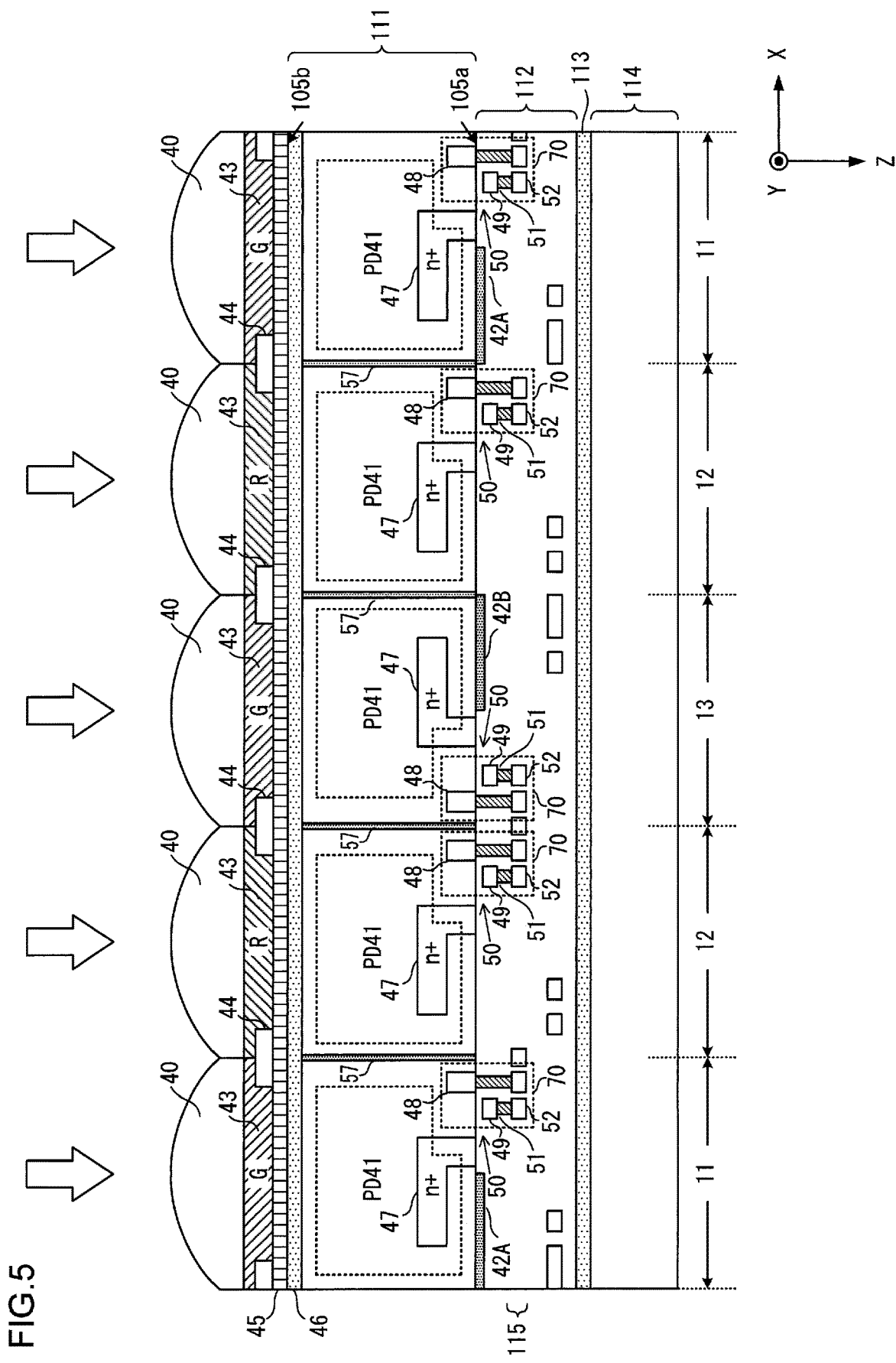

The reflecting portions 42A and the reflecting portions 42B are each formed by using a conductive film in the metal layer 115 in the embodiment described above. However, a reflecting portion may be disposed at a location other than the metal layer 115. In addition, a reflecting portion may be constituted of a material other than a conductor (metal). FIG. 5 illustrates, in a sectional view, a structure that may be adopted in the image sensor achieved as variation 1. The image sensor in variation 1 includes reflecting portions 42A and reflecting portions 42B, each directly laminated on the semiconductor layer 111. The reflecting portions 42A and the reflecting portions 42B may be constituted with, for instance, an oxide film or a nitride film. In more specific terms, they may be constituted with a silicon oxide film, a silicon nitride film, a silicone oxy-nitride film, or a multilayer film formed by layering the films listed above. It is to be noted that reflecting portions may be formed by using a polysilicon. In addition, reflecting portions may be laminated on the semiconductor layer 111 via an insulating film. The reflecting portions are disposed at positions closer to the semiconductor layer 111 in this variation, compared to the positions taken by the reflecting portions constituted with a conductor film in the metal layer 115. This means that light reflected by a reflecting portion is not allowed to readily enter an adjacent pixel. Consequently, noise in the signal generated at the adjacent pixel can be minimized.

(Variation 2)

Figure 6:
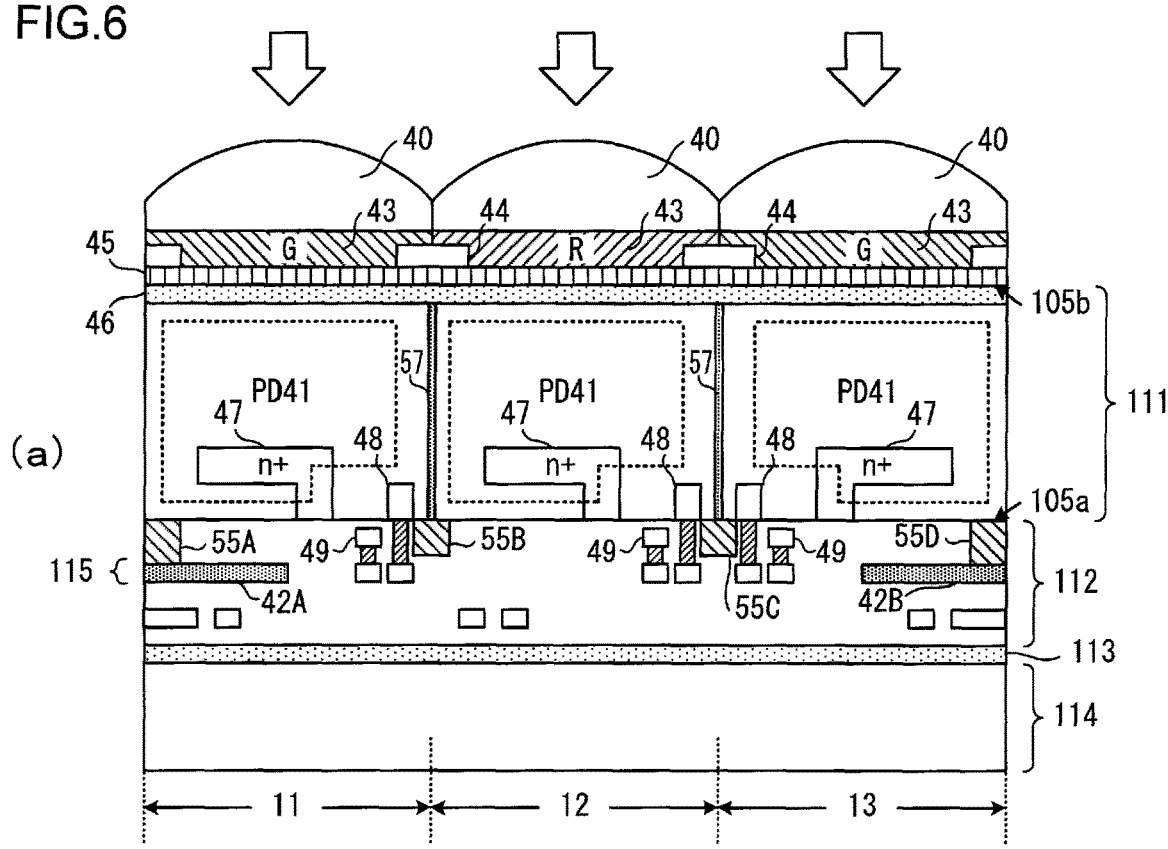
FIG. 6 Sectional views of structures that may be adopted in the image sensor achieved in variation 2
Figure 6:
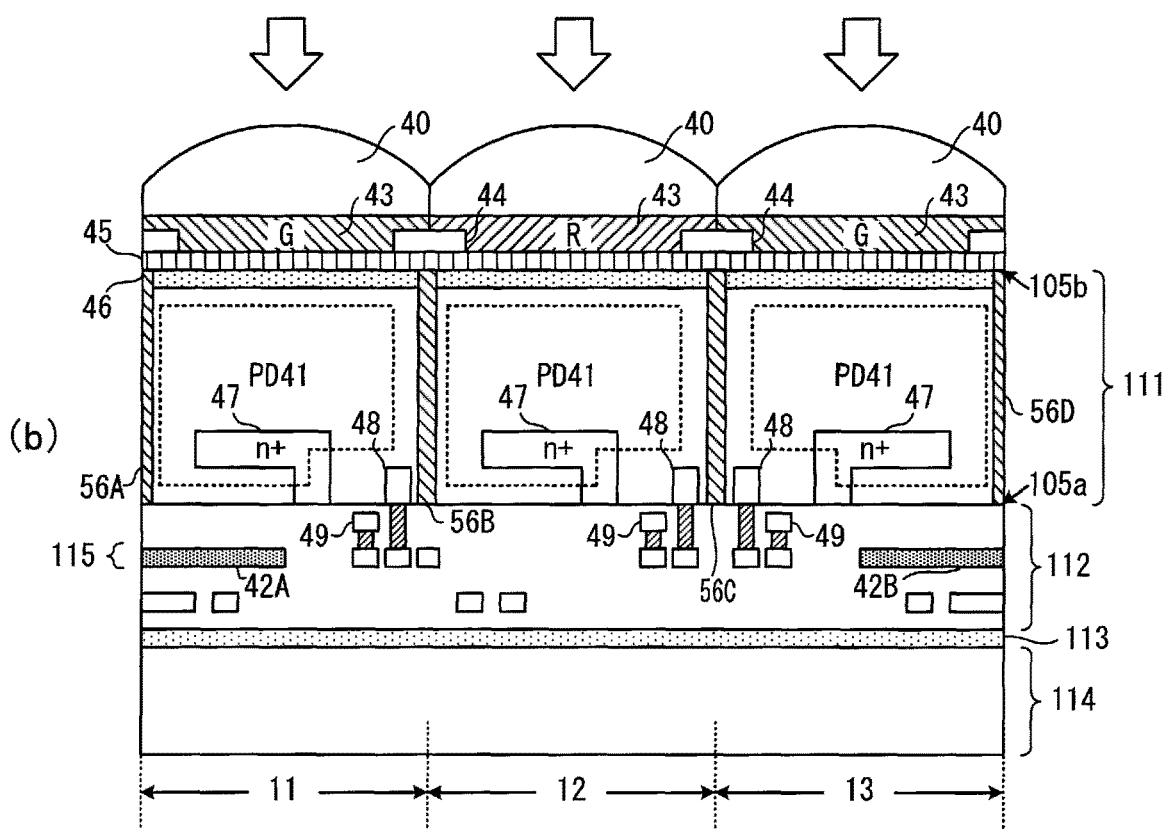

FIG. 6 illustrates, in sectional views, structures that may be adopted in the image sensor achieved as variation 2. The image sensor 22 in variation 2 further includes light shielding portions (a light shielding portion 55A through a light shielding portion 55D) or 56 (a light shielding portion 56A through a light shielding portion 56B), in addition to the reflecting portions 42A and the reflecting portions 42B, as illustrated in FIG. 6(a) and FIG. 6(b). The light shielding portions 55 in FIG. 6(*a*) are constituted with a conductor film (metal film), a polysilicon film or the like. The light shielding portion 55A is disposed between the photoelectric conversion unit 41 and the reflecting portion 42A in an image-capturing/focus detection pixel 11, whereas the light shielding portion 55D is disposed between the photoelectric conversion unit 41 and the reflecting portion 42B in an image-capturing/focus detection pixel 13. The light shielding portions 56 in FIG. 6(*b*) are formed through DTI (deep trench isolation). Namely, in the example presented in FIG. 6(*b*), a trench is formed between pixels and an oxide film, a nitride film, a polysilicon film or the like is embedded in the trench. The light shielding portions 56 are each disposed between two photoelectric conversion units 41 disposed next to each other. For instance, the light shielding portion 56B is disposed between the photoelectric conversion unit 41 in an image-capturing/focus detection pixel 11 and the photoelectric conversion unit 41 in an image-capturing pixel 12, whereas the light shielding portion 56C is disposed between the photoelectric conversion unit 41 in an image-capturing/focus detection pixel 13 and the photoelectric conversion unit 41 in the image-capturing pixel 12.

The light shielding portions 55 or the light shielding portions 56 included in this variation prevent entry of light reflected by the reflecting portion 42A and the reflecting portion 42B into adjacent pixels, which, in turn, makes it possible to prevent crosstalk between pixels. In addition, since light is directed via the light shielding portions 55 or the light shielding portions 56 to reenter the photoelectric conversion units 41, the sensitivity of the photoelectric conversion units 41 can be improved, which makes it possible to improve the accuracy of focus detection. It is to be noted that the pixels may each include both a light shielding portion 55 and a light shielding portion 56. Furthermore, the light shielding portions 55 (the light shielding portion 55A through the light shielding portion 55D) and the light shielding portions 56 (the light shielding portion 56A through the light shielding portion 56D) may be constituted as reflecting portions 55 (a reflecting portion 55A through a reflecting portion 55D) and reflecting portions 56 (a reflecting portion 56A through a reflecting portion 56D) respectively.

(Variation 3)

Figure 7:
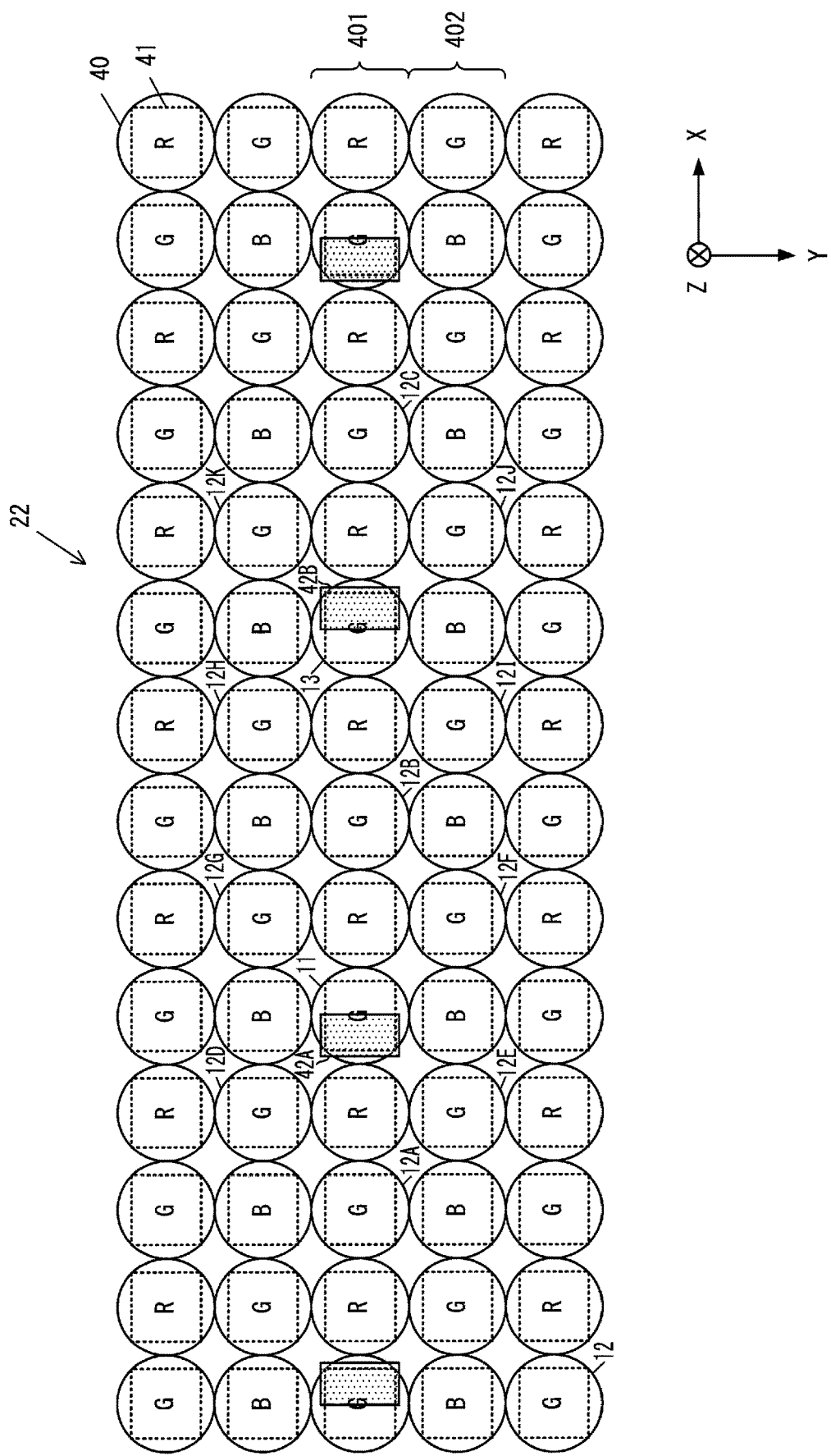
FIG. 7 A diagram illustrating how pixels may be disposed in the image sensor achieved in variation 3
Figure 8:
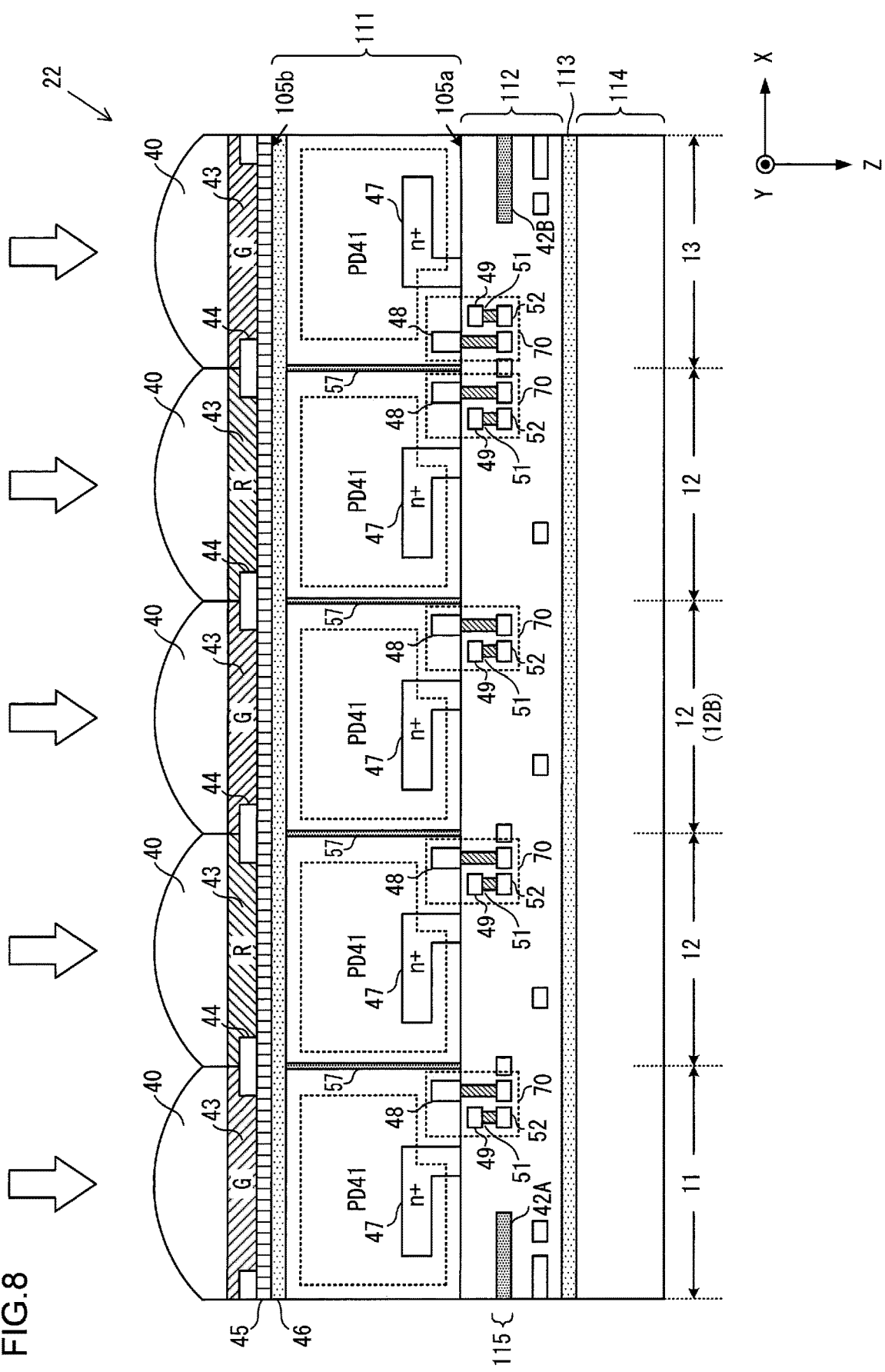
FIG. 8 A sectional view of a structure that may be adopted in the image sensor achieved in variation 3

FIG. 7 presents an example of a positional arrangement with which pixels may be disposed at the image sensor achieved as variation 3 and FIG. 8 illustrates, in a sectional view, a structure that may be adopted in the image sensor in variation 3. In the embodiment described earlier, the image-capturing/focus detection pixels 11 and 13 are disposed at alternate positions, with an R image-capturing pixel 12 present between an image-capturing/focus detection pixel 11 and an image-capturing/focus detection pixel 13, along the row direction. As an alternative, image-capturing/focus detection pixels 11 and 13 may be disposed at alternate positions along the row direction (along the X axis), with two R image-capturing pixels 12 and a G image-capturing pixel 12 disposed between an image-capturing/focus detection pixel 11 and an image-capturing/focus detection pixel 13, as shown in FIG. 7 and FIG. 8.

Figure 9:
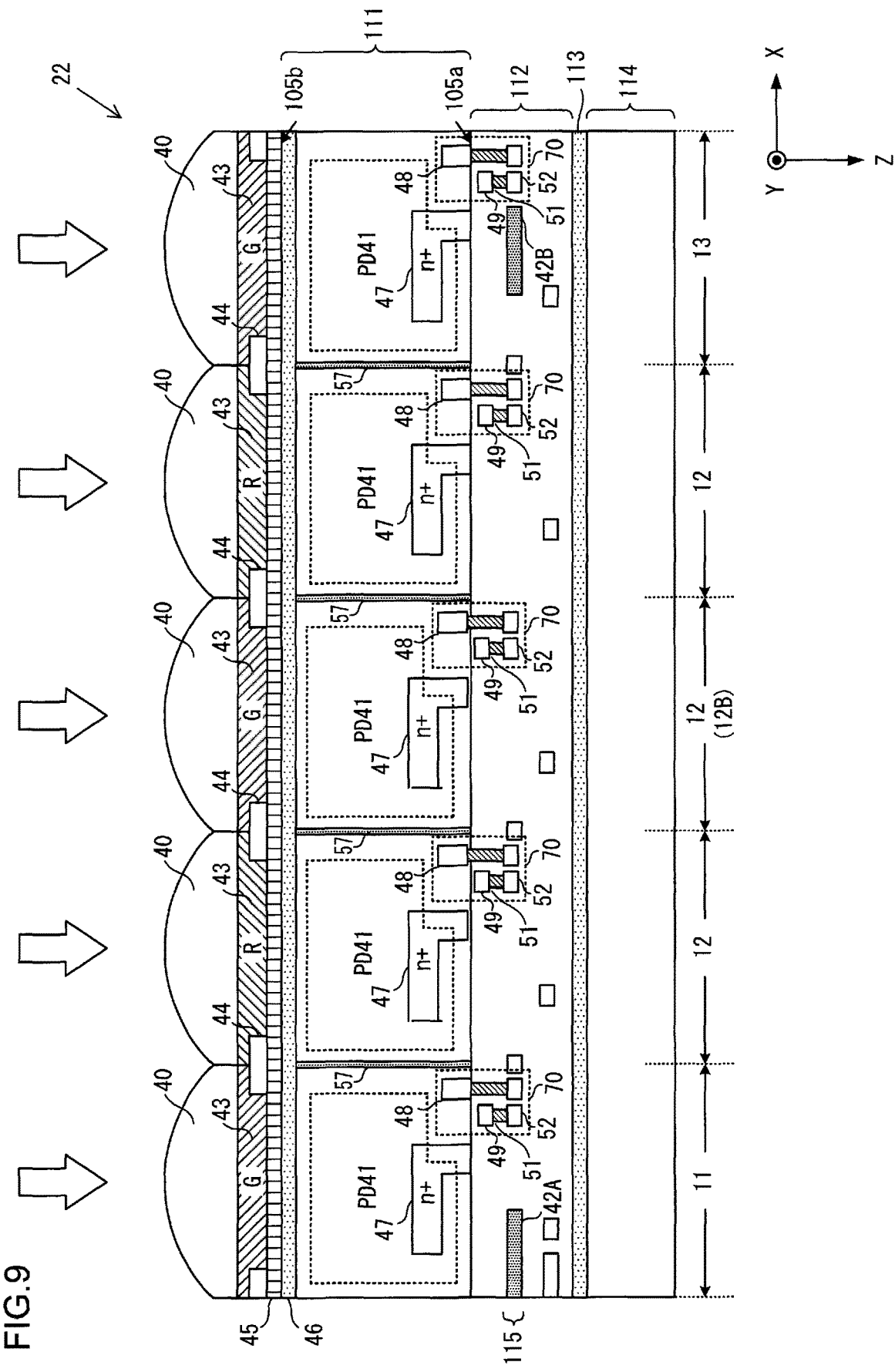
FIG. 9 A sectional view of another structure that may be adopted in the image sensor in variation 3

FIG. 8 and FIG. 9 each illustrate, in a sectional view, a structure that may be adopted in the image sensor achieved in variation 3. In the example presented in FIG. 8, an image-capturing/focus detection pixel 11 and an image-capturing/focus detection pixel 13 are disposed so that the positions of the photoelectric conversion unit 41 and the output unit 70 in the image-capturing/focus detection pixel 11 and the positions of the photoelectric conversion unit 41 and the output unit 70 in the image-capturing/focus detection pixel 13 achieve symmetry (left/right symmetry) relative to the optical axis. As an alternative, the image-capturing/focus detection pixel 11 and the image-capturing/focus detection pixel 13 may be similar to each other in structure, except for the positions of the respective reflecting portions 42A and 42B.

In addition, in the embodiment described above, a signal generated based upon an electric charge resulting from photoelectric conversion of light reflected by a reflecting portion is calculated by using a signal output from an image-capturing/focus detection pixel and a signal output from one image-capturing pixel in a subtraction operation. As an alternative, a signal generated based upon an electric charge resulting from photoelectric conversion of light reflected from a reflecting portion may be calculated by using a signal provided from an image-capturing/focus detection pixel and the average value of the signal values, indicated in signals provided from two image-capturing pixels, in a subtraction operation. For instance, the signals output from G image-capturing pixels 12A, 12B and 12C disposed as illustrated in FIG. 7, among the G image-capturing pixels 12 in a pixel group 401, and signals output from image-capturing/focus detection pixels 11 and 13 may be used. In this case, the focus detection unit 21*a* calculates a signal S2 generated based upon an electric charge resulting from photoelectric conversion of a second light flux reflected by the reflecting portion 42A by using the signal output from the image-capturing/focus detection pixel 11 and the average value of the signal values indicated in the signals output from the image-capturing pixels 12A and 12B, in a subtraction operation. Likewise, the focus detection unit 21*a* calculates a signal S3 generated based upon an electric charge resulting from photoelectric conversion of a first light flux reflected by the reflecting portion 42B by using the signal output from the image-capturing/focus detection pixel 13 and the average value of the signal values indicated in the signals output from the G image-capturing pixels 12B and 12C in a subtraction operation. The focus detection unit 21*a* is then able to calculate a defocus quantity through a correlation operation executed by using the signal S2 and the signal S3.

As a further alternative, a signal generated based upon an electric charge resulting from photoelectric conversion of light reflected by a reflecting portion may be calculated by using the signal output from an image-capturing/focus detection pixel and the average value of the signal values indicated in signals output from a plurality of image-capturing pixels disposed around the image-capturing/focus detection pixel, in a subtraction operation. For instance, the signals output from G image-capturing pixels 12D through 12K disposed as illustrated in FIG. 7 among the G image-capturing pixels 12 in a pixel group 402, and the signals output from image-capturing/focus detection pixels 11 and 13 may be used. The focus detection unit 21*a* calculates a signal S2 generated based upon an electric charge resulting from photoelectric conversion of a second light flux reflected by the reflecting portion 42A by using the signal output from the image-capturing/focus detection pixel 11 and the average value of the signal values indicated in the signals output from the image-capturing pixels 12D, 12E, 12F and 12G in a subtraction operation. Likewise, the focus detection unit 21*a* calculates a signal S3 generated based upon an electric charge resulting from photoelectric conversion of a first light flux reflected by the reflecting portion 42B by using the signal output from the image-capturing/focus detection pixel 14 and the average value of the signal values indicated in the signals output from the image-capturing pixels 12H, 12I, 12J and 12K in a subtraction operation. The focus detection unit 21a is then able to calculate the defocus quantity through a correlation operation executed by using the signal S2 and the signal S3.

(Variation 4)

Figure 10:
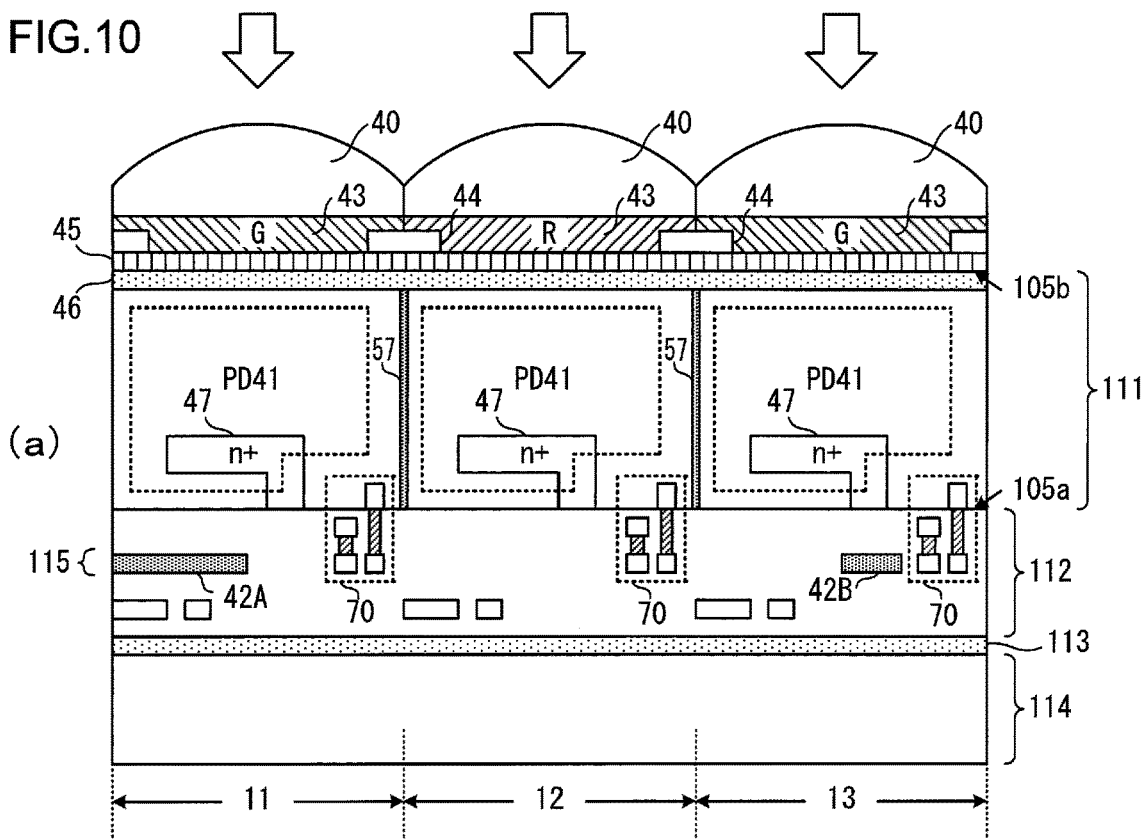
FIG. 10 Sectional views of structures that may be adopted in the image sensor achieved in variation 4
Figure 10:
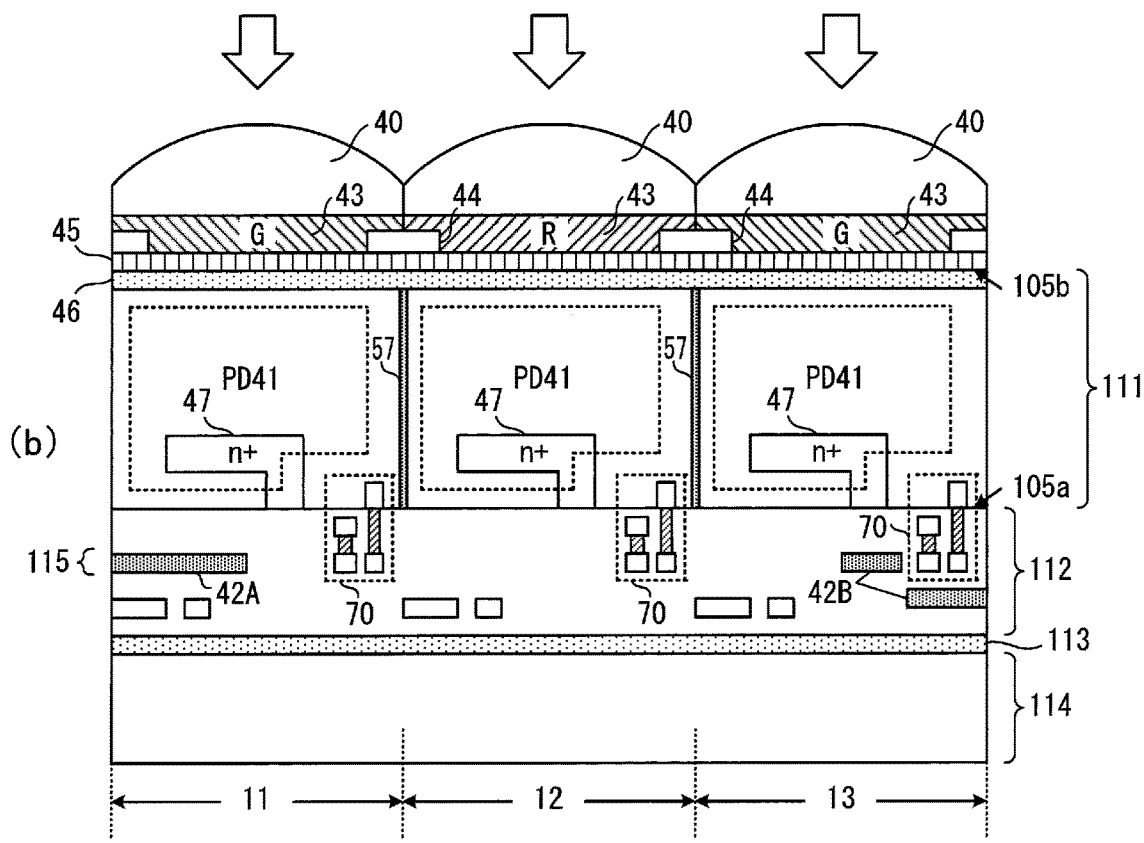
Figure 11:
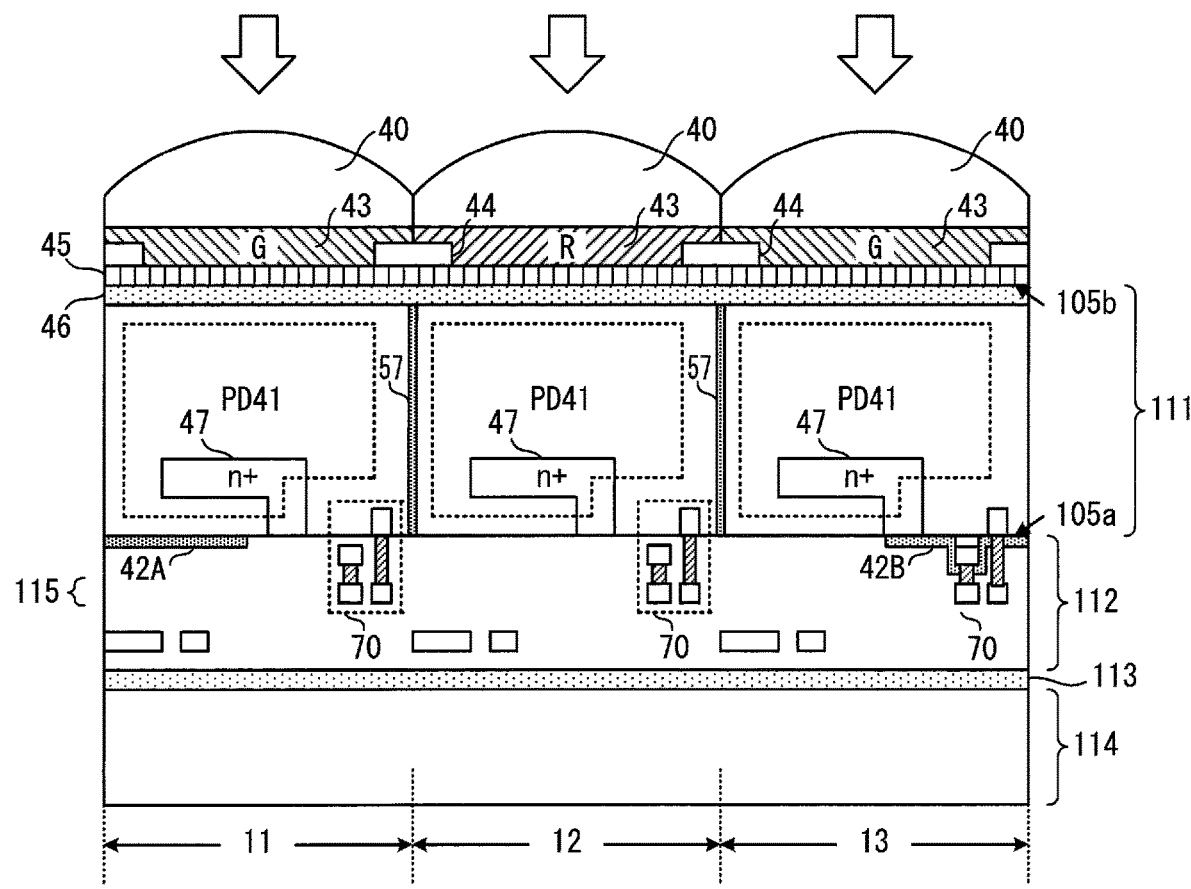
FIG. 11 A sectional view of another structure that may be adopted in the image sensor in variation 4

FIG. 10 illustrates, in sectional views, structures that may be adopted in the image sensor achieved as variation 4. In the embodiment described earlier, the positions of the photoelectric conversion unit 41 and the output unit 70 in an image-capturing/focus detection pixel 11 and the positions of the photoelectric conversion unit 41 and the output unit 70 in an image-capturing/focus detection pixel 13 achieve symmetry (left/right symmetry) relative to the optical axis. As an alternative, the image-capturing/focus detection pixel 11 and the image-capturing/focus detection pixel 13 may adopt structures similar to each other except for the positions of the respective reflecting portions 42A and 42B as illustrated in FIG. 10. In addition, the reflecting portion 42A or 42B may be disposed over a plurality of layers. In the example presented in FIG. 10(b), the reflecting portion 42B is formed in two layers. Furthermore, the image-capturing/focus detection pixel 11 and the image-capturing/focus detection pixel 13 may adopt structures similar to each other except for the positions of the respective reflecting portions 42A and 42B as illustrated in FIG. 11, and the reflecting portion 42A and the reflecting portion 42B may be formed by using an oxide film, a nitride film or the like as in variation 1. Such reflecting portions 42A and 42B may be formed by using a plurality of insulating films. In the image-capturing/focus detection pixel 13 in FIG. 11, its reflecting portion 42B is formed by using a plurality of insulating films including a gate insulating film for the output unit 70 and an insulating film disposed between wirings.

(Variation 5)

In the embodiment and the variations described above, the reflecting portions 42A and the reflecting portions 42B each reflect light having passed through the corresponding photoelectric conversion unit 41 and focus detection is executed by using the signal components attributable to the reflected light. While the image-capturing/focus detection pixels 11 and the image-capturing/focus detection pixels 13 each include a G-color filter in the examples described above, the image-capturing/focus detection pixels 11 and the image-capturing/focus detection pixels 13 may instead each include an R-color filter. In such a case, signals generated with light in a long wavelength range, which is readily transmitted through the photoelectric conversion units 41, such as infrared light or near infrared light, can be used in focus detection. Moreover, since the use of light in a long wavelength range, which is readily transmitted through the photoelectric conversion units 41, is more desirable, the present invention can be adopted in industrial cameras or medical cameras that use infrared or near infrared images.

(Variation 6)

While the focusing lens is controlled based upon a calculated defocus quantity in the embodiment described above, the present invention is not limited to this example. The operations of a zoom lens, an aperture or the like may instead be controlled based upon the defocus quantity.

(Variation 7)

The image sensor 22 in the embodiment described above is configured as a back illuminated image sensor. However, the image sensor 22 may instead be configured as a front illuminated image sensor having a wiring layer disposed on the side where the light entry surface is located.

(Variation 8)

While G-color filters are disposed at the image-capturing/focus detection pixels 11 and the image-capturing/focus detection pixels 13 in the embodiment described above, R-color or B-color filters may instead be disposed at the image-capturing/focus detection pixels. In addition, the image-capturing/focus detection pixels 11 and the image-capturing/focus detection pixels 13 may each include a filter (white-color filter) that allows the light having entered therein to be transmitted through over the entire wavelength range. The presence of such a white-color filter makes it possible to increase the amount of light entering the focus detection pixel, which, in turn, improves the sensitivity of the photoelectric conversion unit 41. Furthermore, pixels each having a white-color filter disposed thereat may be exclusively used as focus detection pixels.

(Variation 9)

Any of the image sensors described in reference to the embodiment and the variations may be adopted in a laminated sensor (stacked image sensor) configured by laminating a plurality of substrates (e.g., a plurality of semiconductor substrates). For instance, an image sensor may comprise a first substrate at which pixels each having a photoelectric conversion unit are disposed, a second substrate at which an A/D conversion unit that converts signals output from the pixels are converted to digital signals are disposed, and a third substrate at which an image processing unit that executes various types of image processing on the digital signals output from the A/D conversion unit is disposed, one substrate laminated on top of another substrate. In this configuration, the first substrate, the second substrate and the third substrate are disposed in this order starting on the light-entry side.

(Variation 10)

The image sensor 22 described in reference to the embodiment may be adopted in cameras, smart phones, tablets, built-in cameras in PCs, on-vehicle cameras and the like.

While the invention has been described in reference to an embodiment and variations thereof, the present invention is in no way limited to the particulars of these examples. Any other mode conceivable within the scope of the technical teaching of the present invention is also within the scope of the present invention.

The disclosure of the following priority application is herein Incorporated by reference:
Japanese Patent Application No. 2016-70959 filed Mar. 31, 2016

REFERENCE SIGNS LIST

2 . . . camera body, 3 . . . exchangeable lens, 21 . . . body control unit, 22 . . . image sensor, 31 . . . image-capturing optical system, 41 . . . photoelectric conversion unit, 42 . . . reflecting portion

The invention claimed is:
1. An image sensor having a plurality of pixels along a first direction, the image sensor comprising:
a first pixel having:
a first filter having first spectral characteristics,
a first photoelectric conversion unit that generates an electric charge through photoelectric conversion of light having been transmitted through the first filter, and
a first reflecting portion disposed at least in a part of an area located in the first direction relative to a center of the first photoelectric conversion unit at a surface crossing a direction in which the light enters the first photoelectric conversion unit, which reflects part of light having been transmitted through the first photoelectric conversion unit toward the first photoelectric conversion unit; and a second pixel having:
  a second filter having the first spectral characteristics,
  a second photoelectric conversion unit that generates an electric charge through photoelectric conversion of light having been transmitted through the second filter, and
  a second reflecting portion disposed at least in a part of an area located in a direction opposite from the first direction relative to a center of the second photoelectric conversion unit at a surface crossing the direction in which the light enters the second photoelectric conversion unit, which reflects part of light having been transmitted through the second photoelectric conversion unit toward the second photoelectric conversion unit; and a third pixel having:
  a third filter having the first spectral characteristics, and
  a third photoelectric conversion unit that generates an electric charge through photoelectric conversion of light having been transmitted through the third filter.

2. The image sensor according to claim 1, wherein:
the first pixel includes a first output unit that outputs a signal generated based upon the electric charge generated in the first photoelectric conversion unit;
the second pixel includes a second output unit that outputs a signal generated based upon the electric charge generated in the second photoelectric conversion unit; and
the first reflecting portion and the second reflecting portion are disposed between the first output unit and the second output unit, or the first output unit and the second output unit are disposed between the first reflecting portion and the second reflecting portion.

3. The image sensor according to claim 2, wherein:
the first output unit includes a first wiring;
the second output unit includes a second wiring; and
the first reflecting portion and the second reflecting portion are disposed between the first wiring and the second wiring, or the first wiring and the second wiring are disposed between the first reflecting portion and the second reflecting portion.

4. The image sensor according to claim 1, wherein:
the first reflecting portion is disposed over a first distance, measured along the first direction, from a separation portion present between the first pixel and an adjacent pixel; and
the second reflecting portion is disposed over a second distance, different from the first distance, measured along the first direction from a separation portion present between the second pixel and an adjacent pixel.

5. The image sensor according to claim 1, further comprising:
a fourth pixel having a fourth photoelectric conversion unit that generates an electric charge through photoelectric conversion of light having entered therein, wherein:
the fourth pixel includes fourth filter having second spectral characteristics with higher transmissivity to light with a shorter wavelength compared to the first spectral characteristics.

6. The image sensor according to claim 1, wherein:
the first pixel is disposed next to the second pixel; and
a light shielding portion or another reflecting portion is disposed between the first photoelectric conversion unit and the second photoelectric conversion unit.

7. The image sensor according to claim 1, wherein:
the third pixel is disposed between the first pixel and the second pixel; and
a light shielding portion or another reflecting portion is disposed at least either between the first photoelectric conversion unit and the third photoelectric conversion unit or between the second photoelectric conversion unit and the third photoelectric conversion unit.

8. The image sensor according to claim 7, wherein:
a plurality of third pixels, each identical to the third pixel, are disposed between the first pixel and the second pixel; and
a light shielding portion or another reflecting portion is disposed at least either between the third photoelectric conversion unit in at least one of the plurality of third pixels and the first photoelectric conversion unit or between the third photoelectric conversion unit in at least one of the plurality of third pixels and the second photoelectric conversion unit.

9. The image sensor according to claim 1, wherein:
the first reflecting portion and the second reflecting portion are each constituted with a metal film or an insulating film.

10. An image-capturing device, comprising:
the image sensor according to claim 1; and
a control unit that controls a position of a focusing lens based upon a signal output from the first pixel and a signal output from the second pixel in the image sensor that captures an image formed via an optical system having included therein the focusing lens, so as to achieve an in-focus state at the image sensor for the image formed via the optical system.

11. An image-capturing device, comprising:
the image sensor according to claim 1; and
a control unit that controls a position of a focusing lens based upon a signal output from the first pixel, a signal output from the second pixel and a signal output from the third pixel in the image sensor that captures an image formed via an optical system that includes the focusing lens, so as to achieve an in-focus state at the image sensor for the image formed via the optical system.

12. An image sensor having a plurality of pixels along a first direction, the image sensor comprising:
a first pixel having;
  a first filter having first spectral characteristics,
  a first photoelectric conversion unit that generates an electric charge through photoelectric conversion of light having been transmitted through the first filter, and a first reflecting portion disposed at least in a part of an area located in the first direction relative to a center of the first photoelectric conversion unit at a surface crossing a direction in which the light enters the first photoelectric conversion unit, which reflects part of light having been transmitted through the first photoelectric conversion unit toward the first photoelectric conversion unit; and a second pixel having;
  a second filter having the first spectral characteristics,
  a second photoelectric conversion unit that generates an electric charge through photoelectric conversion of light having been transmitted through the second filter, and a second reflecting portion disposed at least in a part of an area located in a direction opposite from the first direction relative to a center of the second photoelectric conversion unit at a surface crossing the direction in which the light enters the second photoelectric conversion unit, which reflects part of light having been transmitted through the second photoelectric conversion unit toward the second photoelectric conversion unit; and a third pixel having;
- a third filter having second spectral characteristics with higher transmissivity to light with a shorter wavelength compared to the first spectral characteristics, and
- a third photoelectric conversion unit that generates an electric charge through photoelectric conversion of light having been transmitted through the third filter.

13. The image sensor according to claim 12, wherein:
the first pixel includes a first output unit that outputs a signal generated based upon the electric charge generated in the first photoelectric conversion unit;
the second pixel includes a second output unit that outputs a signal generated based upon the electric charge generated in the second photoelectric conversion unit; and
the first reflecting portion and the second reflecting portion are disposed between the first output unit and the second output unit, or the first output unit and the second output unit are disposed between the first reflecting portion and the second reflecting portion.

14. The image sensor according to claim 13, wherein:
the first output unit includes a first wiring;
the second output unit includes a second wiring; and
the first reflecting portion and the second reflecting portion are disposed between the first wiring and the second wiring, or the first wiring and the second wiring are disposed between the first reflecting portion and the second reflecting portion.

15. The image sensor according to claim 12, wherein:
the first reflecting portion is disposed over a first distance, measured along the first direction, from a separation portion present between the first pixel and an adjacent pixel; and
the second reflecting portion is disposed over a second distance, different from the first distance, measured along the first direction from a separation portion present between the second pixel and an adjacent pixel.

16. The image sensor according to claim 12, wherein:
the first pixel is disposed next to the second pixel; and
a light shielding portion or another reflecting portion is disposed between the first photoelectric conversion unit and the second photoelectric conversion unit.

17. The image sensor according to claim 12, wherein:
the third pixel is disposed between the first pixel and the second pixel; and
a light shielding portion or another reflecting portion is disposed at least either between the first photoelectric conversion unit and the third photoelectric conversion unit or between the second photoelectric conversion unit and the third photoelectric conversion unit.

18. The image sensor according to claim 12, wherein:
a plurality of third pixels, each identical to the third pixel, are disposed between the first pixel and the second pixel; and
a light shielding portion or another reflecting portion is disposed at least either between the third photoelectric conversion unit in at least one of the plurality of third pixels and the first photoelectric conversion unit or between the third photoelectric conversion unit in at least one of the plurality of third pixels and the second photoelectric conversion unit.

19. An image-capturing device, comprising:
the image sensor according to claim 12; and
a control unit that controls a position of a focusing lens based upon a signal output from the first pixel and a signal output from the second pixel in the image sensor that captures an image formed via an optical system having included therein the focusing lens, so as to achieve an in-focus state at the image sensor for the image formed via the optical system.

20. An image-capturing device, comprising:
the image sensor according to claim 12; and
a control unit that controls a position of a focusing lens based upon a signal output from the first pixel, a signal output from the second pixel and a signal output from the third pixel in the image sensor that captures an image formed via an optical system that includes the focusing lens, so as to achieve an in-focus state at the image sensor for the image formed via the optical system.

* * * * *